(12) United States Patent
Cheng et al.

(10) Patent No.: US 11,069,614 B2
(45) Date of Patent: *Jul. 20, 2021

(54) SEMICONDUCTOR PACKAGE STRUCTURE

(71) Applicant: TAIWAN SEMICONDUCTOR MANUFACTURING COMPANY LTD., Hsinchu (TW)

(72) Inventors: Hsi-Kuei Cheng, Hsinchu County (TW); Chih-Kang Han, Hsin-Chu (TW); Ching-Fu Chang, Taipei (TW); Hsin-Chieh Huang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/870,458

(22) Filed: May 8, 2020

(65) Prior Publication Data
US 2020/0273795 A1    Aug. 27, 2020

Related U.S. Application Data

(60) Continuation of application No. 16/173,319, filed on Oct. 29, 2018, now Pat. No. 10,692,809, which is a
(Continued)

(51) Int. Cl.
*H01L 23/522*    (2006.01)
*H01L 23/31*    (2006.01)
(Continued)

(52) U.S. Cl.
CPC ...... *H01L 23/5226* (2013.01); *H01L 21/4857* (2013.01); *H01L 23/3121* (2013.01);
(Continued)

(58) Field of Classification Search
CPC ............. H01L 23/5226; H01L 23/3128; H01L 21/4857; H01L 23/5389; H01L 23/3192;
(Continued)

(56) References Cited

U.S. PATENT DOCUMENTS 5,972,804 A   10/1999 Tobin et al.
9,368,563 B2   6/2016 Lin et al.
(Continued)

OTHER PUBLICATIONS

Office Action and Search Report dated Jun. 22, 2020 issued by China National Intellectual Property Administration for counterpart application 201710610887.X.
(Continued)

*Primary Examiner* — Alexander O Williams
(74) *Attorney, Agent, or Firm* — WPAT, P.C., Intellectual Property Attorneys; Anthony King

(57) ABSTRACT

A semiconductor structure includes a die, a molding surrounding the die, a first dielectric layer disposed over the die and the molding, and a second dielectric layer disposed between the first dielectric layer and the die, and between the first dielectric layer and the molding. A material content ratio in the first dielectric layer is substantially greater than that in the second dielectric layer. In some embodiments, the material content ratio substantially inversely affects a mechanical strength of the first dielectric layer and the second dielectric layer.

20 Claims, 13 Drawing Sheets

Related U.S. Application Data division of application No. 15/410,194, filed on Jan. 19, 2017, now Pat. No. 10,128,182.

(60) Provisional application No. 62/394,452, filed on Sep. 14, 2016.

(51) Int. Cl.
*H01L 21/48* (2006.01)
*H01L 23/538* (2006.01)
*H01L 23/00* (2006.01)
*H01L 23/498* (2006.01)

(52) U.S. Cl.
CPC ...... *H01L 23/3128* (2013.01); *H01L 23/3192* (2013.01); *H01L 23/5389* (2013.01); *H01L 24/08* (2013.01); *H01L 24/94* (2013.01); *H01L 23/49816* (2013.01); *H01L 23/562* (2013.01); *H01L 2224/0801* (2013.01); *H01L 2224/08112* (2013.01)

(58) Field of Classification Search
CPC ..... H01L 24/08; H01L 24/94; H01L 23/3121; H01L 23/49816; H01L 23/562; H01L 2224/0801; H01L 2224/08112; H01L 2224/18; H01L 23/522; H01L 23/31; H01L 21/48; H01L 23/538; H01L 23/00; Y02P 80/30
USPC ........................................................ 257/774
See application file for complete search history.

(56) References Cited

U.S. PATENT DOCUMENTS

| | | | |
|---|---|---|---|
| 10,128,182 B2* | 11/2018 | Cheng | .................... H01L 24/08 |
| 10,692,809 B2* | 6/2020 | Cheng | ................. H01L 23/3128 |
| 2005/0277236 A1 | 12/2005 | Shimomura et al. | |
| 2010/0007017 A1 | 1/2010 | Wei et al. | |
| 2014/0084415 A1 | 3/2014 | Lin et al. | |

OTHER PUBLICATIONS

Office Action dated Jan. 11, 2021 issued by Taiwan Intellectual Property Office for counterpart application No. 106113154.

* cited by examiner

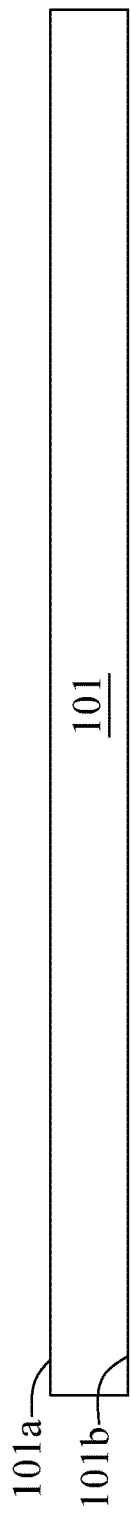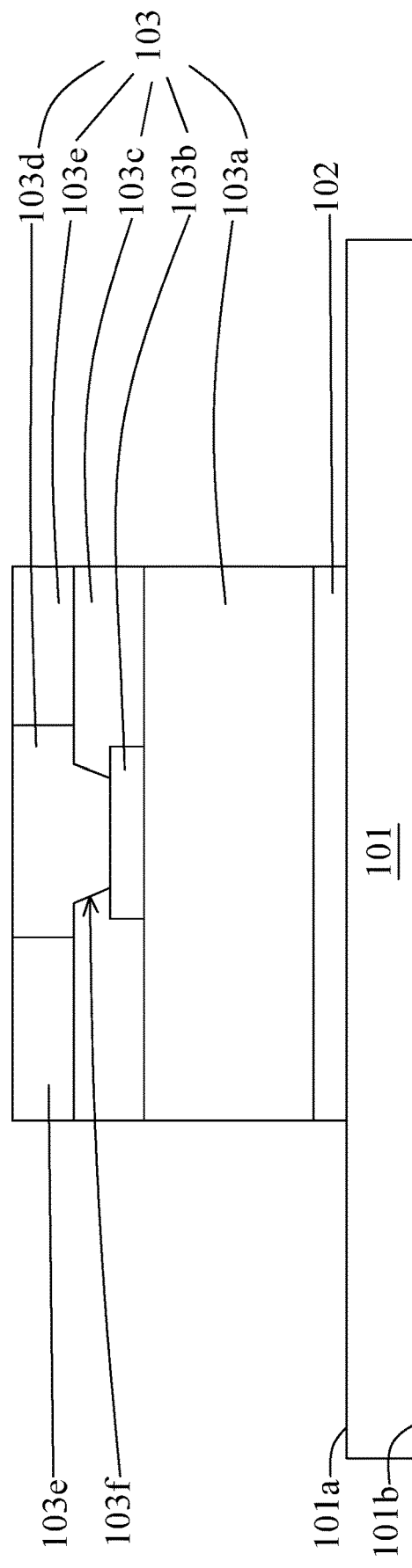

SEMICONDUCTOR PACKAGE STRUCTURE

PRIORITY CLAIM AND CROSS-REFERENCE

This application is a continuation application of U.S. patent application Ser. No. 16/173,319, filed Oct. 29, 2018, now U.S. Pat. No. 10,692,809, which is a divisional application of U.S. patent application Ser. No. 15/410,194, filed on Jan. 19, 2017, now U.S. Pat. No. 10,128,182, entitled of "SEMICONDUCTOR PACKAGE STRUCTURE AND MANUFACTURING METHOD THEREOF", which claims priority to U.S. Provisional Application No. 62/394,452, filed on Sep. 14, 2016, entitled "A Semiconductor Structure and A Manufacturing Method Thereof," which application is hereby incorporated herein by reference.

BACKGROUND

Electronic equipment using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components, inaccurate placement of components or other issues, resulting in a high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

The semiconductor device is assembled with numbers of integrated components including various materials with difference in thermal properties. Since more different components with different materials are involved, a complexity of the manufacturing operations of the semiconductor device is increased. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A-3H are schematic views of manufacturing a semiconductor structure by a method of FIG. 3 in accordance with some embodiments of the present disclosure.

DETAILED DESCRIPTION OF THE DISCLOSURE

Figure 1:
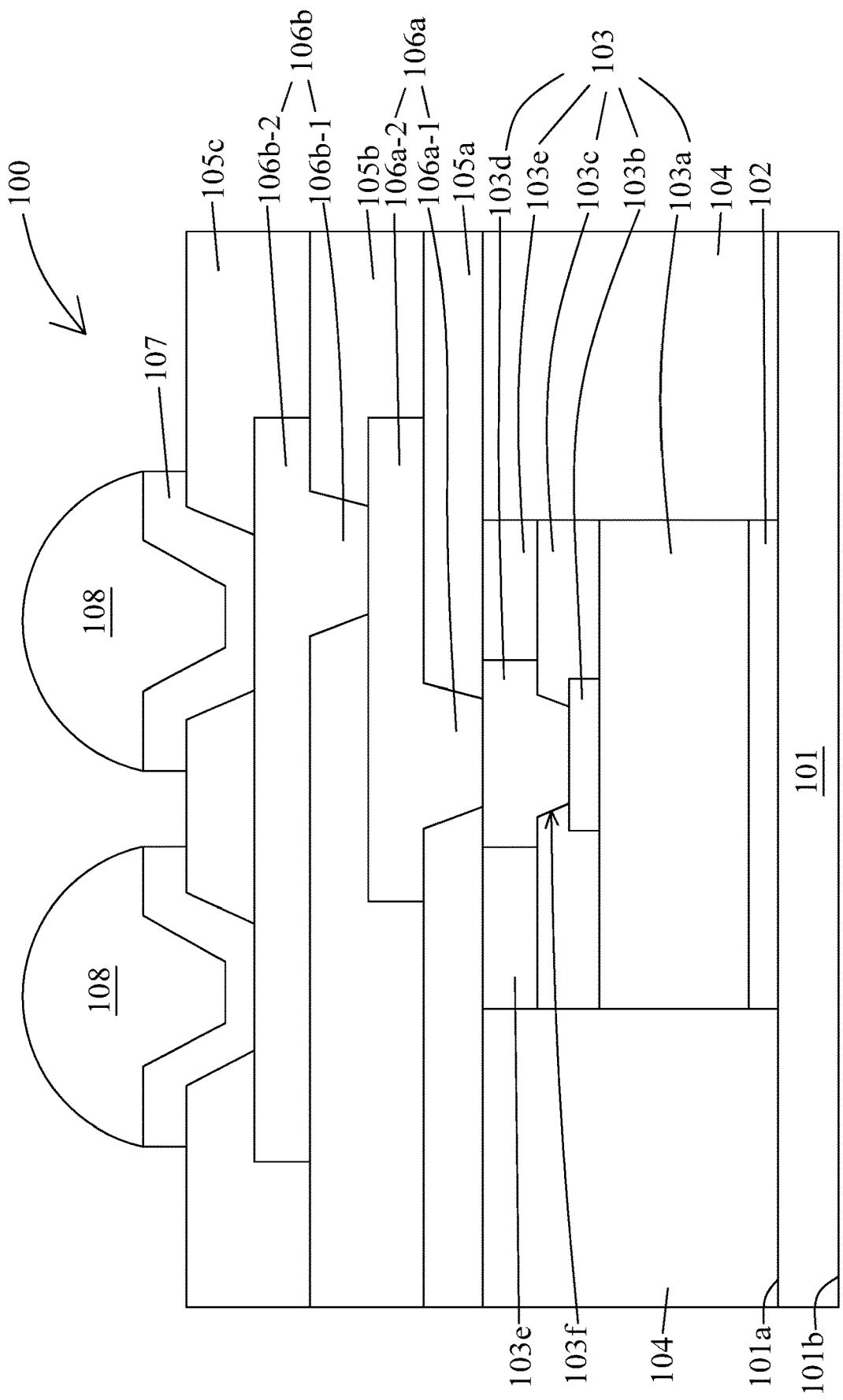
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die is fabricated and singulated from a semiconductive wafer. After singulation, the die is packaged to become a semiconductor package and integrated with another die or package. The die is encapsulated by a molding, and I/O terminals of the die are routed out through conductive lines disposed within a dielectric layer, such that the die is electrically connected to another dies or packages. Such configuration of the semiconductor package involves different kinds of materials (e.g. the molding, the dielectric layer, the conductive structures, etc.) with different thermal properties (e.g. different coefficient of thermal expansion (CTE), etc.). An internal stress would be easily developed between materials during or after thermal processes such as heat treatment, reflowing, etc.

Such a mismatch of CTE would cause crack or warpage developed within the semiconductor package. For example, a stress is developed after several thermal processes, and as a result cracks are developed at where different materials interfacing with each other. The cracks can even propagate through the semiconductor package during subsequent manufacturing operations. The propagation of the cracks would further weaken mechanical strength of the semiconductor package and the electrical connection between the dies and the conductive lines, and ultimately results in failure of the semiconductor package.

In the present disclosure, a semiconductor structure is disclosed. The semiconductor structure includes a die, a molding and a redistribution layer (RDL) disposed over the die and the molding. The RDL includes several dielectric layers disposed over each other. The dielectric layers are heated or cured for a long period of time (for example, more than about 8 hours) under a low temperature (for example, less than 250° C.). Since one of the dielectric layers adjacent to the die is cured for a longer period of time than another one of the dielectric layers disposed over the one of the dielectric layers and away from the die, the dielectric layer adjacent to the die includes less oxygen or nitrogen than another dielectric layer away from the die. As such, a mechanical strength of the dielectric layer adjacent to the die is greater than a mechanical strength of the dielectric layer away from the die. Therefore, the dielectric layer adjacent to the die can resist stress or warpage caused by CTE mismatch between components. Development of crack can be minimized or prevented, and a reliability of the semiconductor structure is improved.

FIG. 1 is a schematic cross sectional view of a semiconductor structure 100 in accordance with various embodiments of the present disclosure. In some embodiments, the semiconductor structure 100 includes a substrate 101, a die 103, a molding 104, a first dielectric layer 105a and a second dielectric layer 105b. In some embodiments, the semiconductor structure 100 is a semiconductor package. In some embodiments, the semiconductor structure 100 is an integrated fan out (InFO) package, that I/O terminals of the die 103 are fanned out and redistributed over a surface of the die 103 in a greater area.

In some embodiments, the substrate 101 includes semiconductive materials such as silicon or other suitable materials. In some embodiments, the substrate 101 is a silicon substrate or silicon wafer. In some embodiments, the substrate 101 includes glass or ceramic. In some embodiments, the substrate 101 is a glass substrate. In some embodiments, the substrate 101 includes several circuitries and one or more active elements such as transistors etc. disposed over or in the substrate 101. In some embodiments, the substrate 101 includes a first surface 101a and a second surface 101b opposite to the first surface 101a. In some embodiments, the first surface 101a of the substrate 101 is a front side of the substrate 101. In some embodiments, the second surface 101b is a back side of the substrate 101.

In some embodiments, the die 103 is disposed over the substrate 101. In some embodiments, the die 103 is fabricated with a predetermined functional circuit within the die 103 produced by photolithography operations. In some embodiments, the die 103 is singulated from a semiconductive wafer by a mechanical or laser blade. In some embodiments, the die 103 comprises a variety of electrical circuits suitable for a particular application. In some embodiments, the electrical circuits include various devices such as transistors, capacitors, resistors, diodes and/or the like. In some embodiments, the die 103 comprises of any one of various known types of semiconductor devices such as memories (such as SRAMS, flash memories, etc.), microprocessors, application-specific integrated circuits (ASICs), digital signal processors (DSPs), or the like. In some embodiments, the die 103 is a logic device die, central computing unit (CPU) die, transceiver die, or the like. In some embodiments, the die 103 has a top cross section (a cross section from the top view of the semiconductor structure 100 as shown in FIG. 1) in a quadrilateral, a rectangular or a square shape. FIG. 1 illustrates the semiconductor structure 100 includes one die, however it is understood that the semiconductor structure 100 can include more than one dies. It is not intended to limit a number of dies in the semiconductor structure 100.

In some embodiments, the die 103 is attached to the substrate 101 by an adhesive 102. In some embodiments, the adhesive 102 is disposed over the first surface 101a of the substrate 101, and the die 103 is disposed over the adhesive 102 and the substrate 101. In some embodiments, the adhesive 102 is die attach film (DAF), a glue, a polymer material, or the like. In some embodiments, the adhesive 102 is ultra-violet (UV) glue, which loses its adhesive property when exposed to UV lights. In some embodiments, the die 103 is temporarily attached to the substrate 101, so that the die 103 is detachable from the substrate 101. In some embodiments, a release coating is disposed between the adhesive 102 and the substrate 101, such that the die 103 is releasable from the substrate 101. In some embodiments, the release coating includes an epoxy-based thermal-release material, which loses its adhesive property when heated. In some embodiments, the release coating is a Light-to-Heat-Conversion (LTHC) release coating.

In some embodiments, the die 103 includes a die substrate 103a, a die pad 103b, a conductive via 103d and a dielectric material 103e. In some embodiments, the die substrate 103a is disposed over the substrate 101. In some embodiments, the die substrate 103a is attached to the first surface 101a of the substrate 101 by the adhesive 102. In some embodiments, the die substrate 103a includes semiconductive materials such as silicon. In some embodiments, the die substrate 103a includes several circuitries and electrical components disposed thereon.

In some embodiments, the die pad 103b is disposed over or within the die substrate 103a. In some embodiments, the die pad 103b is disposed over an active side of the die substrate 103a. In some embodiments, the die pad 103b is electrically connected to a circuitry over or within the die substrate 103a. In some embodiments, the die pad 103b is configured to electrically connect to a circuitry external to the die 103. In some embodiments, the die pad 103b is configured to electrically couple with a conductive trace or a conductive structure. In some embodiments, the die pad 103b includes gold, silver, copper, nickel, tungsten, aluminum, palladium and/or alloys thereof. FIG. 1 illustrates only one die pad 103b over the die substrate 103a for clarity and simplicity, however, an ordinarily skilled person in the art would readily understand that one or more die pads 103b can be present over the die substrate 103a.

In some embodiments, a passivation 103c is disposed over a portion of the die pad 103b. In some embodiments, the passivation 103c surrounds the die pad 103b. In some embodiments, the passivation 103c partially covers a top surface of the die pad 103b. In some embodiments, a portion of the die pad 103b is exposed from the passivation 103c. In some embodiments, the passivation 103c is configured for providing an electrical insulation and a moisture protection for the die substrate 103a, so that the die substrate 103a is isolated from ambient environment. In some embodiments, the passivation 103c is formed with dielectric such as spin-on glass (SOG), silicon oxide, silicon oxynitride, silicon nitride or the like. In some embodiments, the passivation 103c includes a first recess 103f disposed over the die pad 103b for exposing a portion of the die pad 103b. In some embodiments, the first recess 103f is tapered towards the top surface of the die pad 103b.

In some embodiments, a polymeric layer is disposed over the passivation 103c. In some embodiments, the polymeric layer includes polyimide (PI). In some embodiments, a portion of the die pad 103b is exposed from the polymeric layer and the passivation 103c.

In some embodiments, the conductive via 103d is disposed over the die pad 103b. In some embodiments, the conductive via 103d is extended from the die pad 103b and partially surrounded by the passivation 103c. In some embodiments, the conductive via 103d is electrically connected to the die pad 103b. In some embodiments, the conductive via 103d includes conductive material such as gold, silver, copper, nickel, tungsten, aluminum, tin and/or alloys thereof. In some embodiments, the conductive via 103d is a conductive pillar or post. FIG. 1 illustrates only one conductive via 103d over the die pad 103b for clarity and simplicity, however, an ordinarily skilled person in the art would readily understand that one or more conductive via 103d can be present in the die 103.

In some embodiments, the dielectric material 103e surrounds the conductive via 103d. In some embodiments, the dielectric material 103e is disposed over the passivation 103c. In some embodiments, the dielectric material 103e includes polybenzoxazole (PBO). In some embodiments, the dielectric material 103e includes high temperature PBO (HTPBO) which is cured at a temperature of about or greater than 300° C. In some embodiments, the dielectric material 103e includes same or different material from the passivation 103c. In some embodiments, the dielectric material 103e includes same or different material from the polymeric layer.

In some embodiments, the molding 104 is disposed over the substrate 101 and surrounds the die 103. In some embodiments, the dielectric material 103e is surrounded by the molding 104. In some embodiments, the molding 104 is disposed over the first surface 101a of the substrate 101. In some embodiments, the molding 104 can be a single layer film or a composite stack. In some embodiments, the molding 104 includes various materials, such as molding compound, molding underfill, epoxy, resin, or the like. In some embodiments, the molding 104 has a high thermal conductivity, a low moisture absorption rate and a high flexural strength.

In some embodiments, a redistribution layer (RDL) is disposed over the die 103 and the molding 104. In some embodiments, the RDL is configured to re-route a path of circuitry from the die 103 to components external to the die 103, so as to redistribute I/O terminals of the die 103 over the molding 104. In some embodiments, a first RDL (105a and 106a) and a second RDL (105b and 106b) are disposed over the die 103 and the molding 104. In some embodiments, the second RDL (105b and 106b) is disposed over the first RDL (105a and 106a).

In some embodiments, the first RDL (105a and 106a) includes the first dielectric layer 105a and a first conductive trace 106a. In some embodiments, the first dielectric layer 105a is a lower dielectric layer disposed nearer to the substrate 101, the die 103 or the molding 104. In some embodiments, the first dielectric layer 105a is disposed over the dielectric material 103e and the molding 104. In some embodiments, the first dielectric layer 105a is interfaced with the molding 104, the dielectric material 103e and the conductive via 103d. In some embodiments, the first dielectric layer 105a includes polyimide (PI). In some embodiments, the first dielectric layer 105a includes different material from the dielectric material 103e. In some embodiments, a thickness of the first dielectric layer 105a is about 2 μm to about 8 μm. In some embodiments, the thickness of the first dielectric layer 105a is about 4 μm to about 6 μm.

In some embodiments, the first conductive trace 106a is disposed over the first dielectric layer 105a. In some embodiments, the first conductive trace 106a is partially through the first dielectric layer 105a to electrically connect to the conductive via 103d or the die pad 103b. In some embodiments, the first conductive trace 106a includes conductive material such as gold, silver, copper, nickel, tungsten, aluminum, palladium and/or alloys thereof.

In some embodiments, the first conductive trace 106a includes a first via portion 106a-1 and a first land portion 106a-2. In some embodiments, the first via portion 106a-1 extends through a portion of the first dielectric layer 105a towards the conductive via 103d or the die pad 103b. In some embodiments, the first land portion 106a-2 is disposed over the first dielectric layer 105a. In some embodiments, the first land portion 106a-2 is electrically connected to the conductive via 103d or the die pad 103b through the first via portion 106a-1. In some embodiments, the first land portion 106a-2 is configured to receive a conductive line or a conductive structure.

In some embodiments, the second RDL (105b and 106b) includes the second dielectric layer 105b and a second conductive trace 106b. In some embodiments, the second dielectric layer 105b is disposed over the first dielectric layer 105a and the first conductive trace 106a. In some embodiments, the second dielectric layer 105b is an upper dielectric layer disposed further the substrate 101, the die 103 or the molding 104. In some embodiments, the second dielectric layer 105b is interfaced with the first dielectric layer 105a. In some embodiments, the first conductive trace 106a is surrounded by the second dielectric layer 105b. In some embodiments, the second dielectric layer 105b includes polyimide (PI). In some embodiments, the second dielectric layer 105b includes same material as the first dielectric layer 105a. In some embodiments, the second dielectric layer 105b includes different material from the dielectric material 103e. In some embodiments, a thickness of the second dielectric layer 105b is about 4 μm to about 13 μm. In some embodiments, the thickness of the second dielectric layer 105b is about 5 μm to about 10 μm. In some embodiments, the thickness of the second dielectric layer 105b is substantially greater than the thickness of the first dielectric layer 105a.

In some embodiments, the second conductive trace 106b is disposed over the second dielectric layer 105b. In some embodiments, the second conductive trace 106b is partially through the second dielectric layer 105b to electrically connect to the first conductive trace 106a, the conductive via 103d or the die pad 103b. In some embodiments, the second conductive trace 106b includes conductive material such as gold, silver, copper, nickel, tungsten, aluminum, palladium and/or alloys thereof.

In some embodiments, the second conductive trace 106b includes a second via portion 106b-1 and a second land portion 106b-2. In some embodiments, the second via portion 106b-1 extends through a portion of the second dielectric layer 105b towards the first conductive trace 106a, the conductive via 103d or the die pad 103b. In some embodiments, the second land portion 106b-2 is disposed over the second dielectric layer 105b. In some embodiments, the second land portion 106b-2 is electrically connected to the conductive via 103d or the die pad 103b through the second via portion 106b-1. In some embodiments, the second land portion 106b-2 is configured to receive a conductive line or a conductive structure.

In some embodiments, a material content ratio in a dielectric layer substantially inversely affects a mechanical strength of the dielectric layer. In some embodiments, a material content ratio in the second dielectric layer 105b is substantially greater than a material content ratio in the first dielectric layer 105a, while a mechanical strength of the second dielectric layer 105b is substantially less than a mechanical strength of the first dielectric layer 105a. In some embodiments, the material content ratio includes at least one of oxygen content ratio or nitrogen content ratio. In some embodiments, the first dielectric layer 105a includes oxygen and nitrogen, and the second dielectric layer 105b also includes oxygen and nitrogen. In some embodiments, the second dielectric layer 105b includes more oxygen than the first dielectric layer 105a. In some embodiments, the second dielectric layer 105b includes more nitrogen than the first dielectric layer 105a In some embodiments, the oxygen content ratio of the second dielectric layer 105b is substantially greater than the oxygen ratio of the first dielectric layer 105a. In some embodiments, the nitrogen content ratio of the second dielectric layer 105b is substantially greater than the nitrogen content ratio of the first dielectric layer 105a.

In some embodiments, the oxygen content ratio of the first dielectric layer 105a is substantially less than about 12% of overall content in the first dielectric layer 105a. In some embodiments, the oxygen content ratio of the first dielectric layer 105a is substantially less than about 10% of overall content in the first dielectric layer 105a. In some embodiments, the oxygen content ratio of the first dielectric layer 105a is about 3% to about 11% of overall content in the first dielectric layer 105a. In some embodiments, the oxygen content ratio of the first dielectric layer 105a is about 5% to about 10% of overall content in the first dielectric layer 105a.

In some embodiments, the oxygen content ratio of the second dielectric layer 105b is substantially greater than about 8% of overall content in the second dielectric layer 105b. In some embodiments, the oxygen content ratio of the second dielectric layer 105b is substantially greater than about 10% of overall content in the second dielectric layer 105b. In some embodiments, the oxygen content ratio of the second dielectric layer 105b is about 9% to about 15% of overall content in the second dielectric layer 105b. In some embodiments, the oxygen content ratio of the second dielectric layer 105b is about 10% to about 13% of overall content in the second dielectric layer 105b.

In some embodiments, the nitrogen content ratio of the first dielectric layer 105a is substantially less than about 23% of overall content in the first dielectric layer 105a. In some embodiments, the nitrogen content ratio of the first dielectric layer 105a is substantially less than about 20% of overall content in the first dielectric layer 105a. In some embodiments, the nitrogen content ratio of the first dielectric layer 105a is about 12% to about 22% of overall content in the first dielectric layer 105a. In some embodiments, the nitrogen content ratio of the first dielectric layer 105a is about 15% to about 20% of overall content in the first dielectric layer 105a.

In some embodiments, the nitrogen content ratio of the second dielectric layer 105b is substantially greater than about 18% of overall content in the second dielectric layer 105b. In some embodiments, the nitrogen content ratio of the second dielectric layer 105b is substantially greater than about 20% of overall content in the second dielectric layer 105b. In some embodiments, the nitrogen content ratio of the second dielectric layer 105b is about 19% to about 27% of overall content in the second dielectric layer 105b. In some embodiments, the nitrogen content ratio of the second dielectric layer 105b is about 20% to about 25% of overall content in the second dielectric layer 105b.

In some embodiments, the material content ratio in the second dielectric layer 105b is substantially greater than the material content ratio in the first dielectric layer 105a, while the mechanical strength of the second dielectric layer 105b is substantially less than the mechanical strength of the first dielectric layer 105a. In some embodiments, the mechanical strength of the first dielectric layer 105a is substantially greater than the mechanical strength of the second dielectric layer 105b. In some embodiments, a Young's modulus of the first dielectric layer 105a is substantially greater than a Young's modulus of the second dielectric layer 105b. In some embodiments, the oxygen content ratio of the first dielectric layer 105a is substantially less than the oxygen content ratio of the second dielectric layer 105b, and therefore the mechanical strength of the first dielectric layer 105a is substantially greater than the mechanical strength of the second dielectric layer 105b. In some embodiments, the nitrogen content ratio of the first dielectric layer 105a is substantially less than the nitrogen content ratio of the second dielectric layer 105b, and therefore the mechanical strength of the first dielectric layer 105a is substantially greater than the mechanical strength of the second dielectric layer 105b. In some embodiments, CTE of the first dielectric layer 105a is different from CTE of the dielectric material 103e, while the first dielectric layer 105a can resist a stress or warpage caused by CTE mismatch between the first dielectric layer 150a and the dielectric material. In some embodiments, the first dielectric layer 105a has higher mechanical strength, larger Young's modulus, more oxygen or more nitrogen (compared with the second dielectric layer 105b), and thus the first dielectric layer 105a can resist the stress or prevent development of warpage or crack in the semiconductor structure 100.

In some embodiments, the semiconductor structure 100 includes a third dielectric layer 105c, a bump pad 107 and a conductive bump 108. In some embodiments, the first dielectric layer 105a is a lower dielectric layer disposed over the die 103 and the molding 104, and the second dielectric layer 105b is an intermediate dielectric layer disposed over the first dielectric layer 105a In some embodiments, the third dielectric layer 105c is an upper dielectric layer disposed over the second dielectric layer 105b and the first dielectric layer 105a. In some embodiments, the third dielectric layer 105c is disposed over the second dielectric layer 105b and surrounds the second conductive trace 106b. In some embodiments, the third dielectric layer 105c includes polyimide (PI). In some embodiments, the third dielectric layer 105c includes same material as the second dielectric layer 105b and the first dielectric layer 105a. In some embodiments, the third dielectric layer 105c includes different material from the dielectric material 103e.

In some embodiments, a thickness of the third dielectric layer 105c is substantially greater than or equal to the thickness of the second dielectric layer 105b. In some embodiments, the thickness of the third dielectric layer 105c is substantially greater than the thickness of the first dielectric layer 105a. In some embodiments, the thickness of the third dielectric layer 105c is about 4 μm to about 13 μm. In some embodiments, the thickness of the third dielectric layer 105c is about 5 μm to about 10 μm. In some embodiments, the thickness of the third dielectric layer 105c is about 6 µm to about 15 µm. In some embodiments, the thickness of the third dielectric layer 105c is about 7 µm to about 11 µm.

In some embodiments, the third dielectric layer 105c includes oxygen and nitrogen. In some embodiments, the third dielectric layer 105c includes more oxygen than the first dielectric layer 105a and the second dielectric layer 105b. In some embodiments, the third dielectric layer 105c includes same oxygen as the second dielectric layer 105b. In some embodiments, the third dielectric layer 105c includes more nitrogen than the first dielectric layer 105a and the second dielectric layer 105b. In some embodiments, the third dielectric layer 105c includes same nitrogen as the second dielectric layer 105b. In some embodiments, an oxygen content ratio of the third dielectric layer 105c is substantially greater than an oxygen content ratio of the first dielectric layer 105a and an oxygen content ratio of the second dielectric layer 105b. In some embodiments, the oxygen content ratio of the third dielectric layer 105c is substantially same as the content oxygen ratio of the second dielectric layer 105b. In some embodiments, a nitrogen content ratio of the third dielectric layer 105c is substantially greater than a nitrogen content ratio of the first dielectric layer 105a and a nitrogen content ratio of the second dielectric layer 105b. In some embodiments, the nitrogen content ratio of the third dielectric layer 105c is substantially same as the nitrogen content ratio of the second dielectric layer 105b.

In some embodiments, the oxygen content ratio of the third dielectric layer 105c is substantially greater than about 8% of overall content in the third dielectric layer 105c. In some embodiments, the oxygen content ratio of the third dielectric layer 105c is substantially greater than about 10% of overall content in the third dielectric layer 105c. In some embodiments, the oxygen content ratio of the third dielectric layer 105c is about 9% to about 20% of overall content in the third dielectric layer 105c. In some embodiments, the oxygen content ratio of the third dielectric layer 105c is about 10% to about 13% of overall content in the third dielectric layer 105c. In some embodiments, the oxygen content ratio of the third dielectric layer 105c is about 12% to about 18% of overall content in the third dielectric layer 105c.

In some embodiments, the nitrogen content ratio of the third dielectric layer 105c is substantially greater than about 18% of overall content in the third dielectric layer 105c. In some embodiments, the nitrogen content ratio of the third dielectric layer 105c is substantially greater than about 20% of overall content in the third dielectric layer 105c. In some embodiments, the nitrogen content ratio of the third dielectric layer 105c is about 19% to about 27% of overall content in the third dielectric layer 105c. In some embodiments, the nitrogen content ratio of third dielectric layer 105c is about 20% to about 25% of overall content in the third dielectric layer 105c.

In some embodiments, the material content ratio in the third dielectric layer 105c is substantially greater than the material content ratio in the first dielectric layer 105a, while a mechanical strength of the third dielectric layer 105c is substantially less than the mechanical strength of the first dielectric layer 105a. In some embodiments, the mechanical strength of the first dielectric layer 105a is substantially greater than the mechanical strength of the second dielectric layer 105b and the mechanical strength of the third dielectric layer 105c. In some embodiments, the Young's modulus of the first dielectric layer 105a is substantially greater than the Young's modulus of the second dielectric layer 105b and a Young's modulus of the third dielectric layer 105c. In some embodiments, the oxygen content ratio of the first dielectric layer 105a is substantially less than the oxygen content ratio of the second dielectric layer 105b and the oxygen content ratio of the third dielectric layer 105c, and therefore the mechanical strength of the first dielectric layer 105a is substantially greater than the mechanical strength of the second dielectric layer 105b and the mechanical strength of the third dielectric layer 105c. In some embodiments, the nitrogen content ratio of the first dielectric layer 105a is substantially less than the nitrogen content ratio of the second dielectric layer 105b and the nitrogen content ratio of the third dielectric layer 105c, and therefore the mechanical strength of the first dielectric layer 105a is substantially greater than the mechanical strength of the second dielectric layer 105b and the mechanical strength of the third dielectric layer 105c.

In some embodiments, the bump pad 107 is disposed over the third dielectric layer 105c and the second conductive trace 106b. In some embodiments, the bump pad 107 is extended through the third dielectric layer 105c towards the second conductive trace 106b, such that the bump pad 107 is electrically connected to the second conductive trace 106b, the first conductive trace 106a, the conductive via 103d or the die pad 103b. In some embodiments, the bump pad 107 is disposed over the second land portion 106b-2 of the second conductive trace 106b. In some embodiments, the bump pad 107 is under bump metallization (UBM) pad. In some embodiments, the bump pad 107 includes gold, silver, copper, nickel, tungsten, aluminum, palladium and/or alloys thereof.

In some embodiments, the conductive bump 108 is disposed over the bump pad 107. In some embodiments, the conductive bump 108 is directly disposed on the second conductive trace 106b. In some embodiments, the conductive bump 108 is electrically connected to the bump pad 107. In some embodiments, the conductive bump 108 is configured to electrically connect to a circuitry or a conductive structure. In some embodiments, the conductive bump 108 includes conductive material such as includes solder, copper, nickel, gold or etc. In some embodiments, the conductive bump 108 is a solder ball, a ball grid array (BGA) ball, controlled collapse chip connection (C4) bump, microbump, a pillar or the like. In some embodiments, the conductive bump 108 is in a spherical, hemispherical or cylindrical shape.

Figure 2:
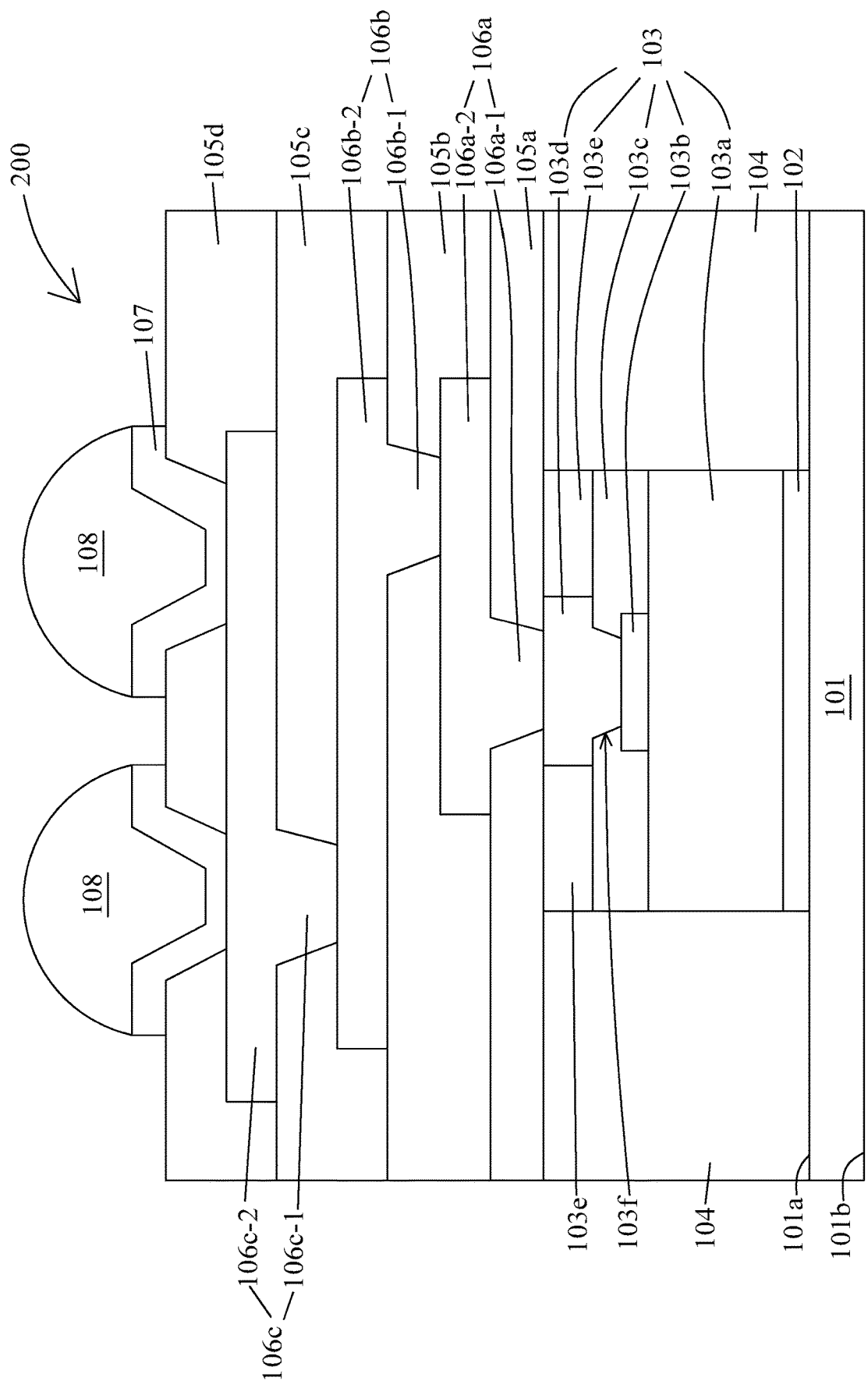
FIG. 2 is a schematic cross sectional view of a semiconductor structure in accordance with some embodiments of the present disclosure.

FIG. 2 is a schematic cross sectional view of a semiconductor structure 200 in accordance with various embodiments of the present disclosure. In some embodiments, the semiconductor structure 200 includes a substrate 101, a die 103, a molding 104, a first dielectric layer 105a, a second dielectric layer 105b, a first conductive trace 106a and a second conductive trace 106b, which have similar configurations as described above or illustrated in FIG. 1.

In some embodiments, the semiconductor structure 200 includes a third RDL (105c and 106c). In some embodiments, the third RDL (105c and 106c) includes the third dielectric layer 105c and a third conductive trace 106c. In some embodiments, the third dielectric layer 105c is disposed over the second dielectric layer 105b and the first dielectric layer 105a. In some embodiments, the third dielectric layer 105c surrounds the second conductive trace 106b. In some embodiments, the third dielectric layer 105c includes polyimide (PI). In some embodiments, the third dielectric layer 105c includes same material as the second dielectric layer 105b and the first dielectric layer 105a. In some embodiments, the third dielectric layer 105c includes different material from the dielectric material 103e.

In some embodiments, a thickness of the third dielectric layer 105c is substantially equal to the thickness of the second dielectric layer 105b. In some embodiments, the thickness of the third dielectric layer 105c is substantially greater than the thickness of the first dielectric layer 105a. In some embodiments, the thickness of the third dielectric layer 105c is about 4 µm to about 13 µm. In some embodiments, the thickness of the third dielectric layer 105c is about 5 µm to about 10 µm.

In some embodiments, the third conductive trace 106c is disposed over the third dielectric layer 105c. In some embodiments, the third conductive trace 106c is partially through the third dielectric layer 105c to electrically connect to the second conductive trace 106b, the first conductive trace 106a, the conductive via 103d or the die pad 103b. In some embodiments, the third conductive trace 106c includes conductive material such as gold, silver, copper, nickel, tungsten, aluminum, palladium and/or alloys thereof.

In some embodiments, the third conductive trace 106c includes a third via portion 106c-1 and a third land portion 106c-2. In some embodiments, the third via portion 106c-1 extends through a portion of the third dielectric layer 105c towards the second conductive trace 106b, the first conductive trace 106a, the conductive via 103d or the die pad 103b. In some embodiments, the third land portion 106c-2 is disposed over the third dielectric layer 105c. In some embodiments, the third land portion 106c-2 is electrically connected to the conductive via 103d or the die pad 103b through the third via portion 106c-1. In some embodiments, the third land portion 106c-2 is configured to receive a conductive line or a conductive structure.

In some embodiments, the semiconductor structure 200 includes a fourth dielectric layer 105d. In some embodiments, the fourth dielectric layer 105d is disposed over the third dielectric layer 105c and surrounds the third conductive trace 106c. In some embodiments, the fourth dielectric layer 105d includes polyimide (PI). In some embodiments, the fourth dielectric layer 105d includes same material as the third dielectric layer 105c, the second dielectric layer 105b and the first dielectric layer 105a. In some embodiments, the fourth dielectric layer 105d includes different material from the dielectric material 103e.

In some embodiments, a thickness of the fourth dielectric layer 105d is substantially greater than the thickness of the third dielectric layer 105c, the thickness of the second dielectric layer 105b and the thickness of the first dielectric layer 105a. In some embodiments, the thickness of the fourth dielectric layer 105d is about 4 µm to about 13 µm. In some embodiments, the thickness of the fourth dielectric layer 105d is about 6 µm to about 11 µm.

In some embodiments, the fourth dielectric layer 105d includes oxygen and nitrogen. In some embodiments, the fourth dielectric layer 105d includes more oxygen than the first dielectric layer 105a, the second dielectric layer 105b and the third dielectric layer 105c. In some embodiments, the fourth dielectric layer 105d includes more nitrogen than the first dielectric layer 105a, the second dielectric layer 105b and the third dielectric layer 105c. In some embodiments, an oxygen content ratio of the fourth dielectric layer 105d is substantially greater than the oxygen content ratio of the first dielectric layer 105a, the oxygen content ratio of the second dielectric layer 105b and the oxygen content ratio of the third dielectric layer 105c. In some embodiments, a nitrogen content ratio of the fourth dielectric layer 105d is substantially greater than the nitrogen content ratio of the first dielectric layer 105a, the nitrogen content ratio of the second dielectric layer 105b and the nitrogen content ratio of the third dielectric layer 105c.

In some embodiments, the oxygen content ratio of the fourth dielectric layer 105d is substantially greater than about 10% of overall content in the fourth dielectric layer 105d. In some embodiments, the oxygen content ratio of the fourth dielectric layer 105d is about 11% to about 20% of overall content in the fourth dielectric layer 105d. In some embodiments, the oxygen content ratio of the fourth dielectric layer 105d is about 12% to about 18% of overall content in the fourth dielectric layer 105d.

In some embodiments, the nitrogen content ratio of the fourth dielectric layer 105d is substantially greater than about 18% of overall content in the fourth dielectric layer 105d. In some embodiments, the nitrogen content ratio of the fourth dielectric layer 105d is about 19% to about 27% of overall content in fourth dielectric layer 105d. In some embodiments, the nitrogen content ratio of the fourth dielectric layer 105d is about 20% to about 25% of overall content in the third dielectric layer 105c.

In some embodiments, a material content ratio in the fourth dielectric layer 105d is substantially greater than the material content ratio in the first dielectric layer 105a, while a mechanical strength of the fourth dielectric layer 105d is substantially less than a mechanical strength of the first dielectric layer 105a. In some embodiments, the mechanical strength of the first dielectric layer 105a is substantially greater than the mechanical strength of the second dielectric layer 105b, the mechanical strength of the third dielectric layer 105c and the mechanical strength of the fourth dielectric layer 105d. In some embodiments, the Young's modulus of the first dielectric layer 105a is substantially greater than the Young's modulus of the second dielectric layer 105b, the Young's modulus of the third dielectric layer 105c and a Young's modulus of the fourth dielectric layer 105d. In some embodiments, the oxygen content ratio of the first dielectric layer 105a is substantially less than the oxygen content ratio of the second dielectric layer 105b, the oxygen content ratio of the third dielectric layer 105c and the oxygen content ratio of the fourth dielectric layer 105d, and therefore the mechanical strength of the first dielectric layer 105a is substantially greater than the mechanical strength of the second dielectric layer 105b, the mechanical strength of the third dielectric layer 105c and the mechanical strength of the fourth dielectric layer 105d. In some embodiments, the nitrogen content ratio of the first dielectric layer 105a is substantially less than the nitrogen content ratio of the second dielectric layer 105b, the nitrogen content ratio of the third dielectric layer 105c and the nitrogen content ratio of the fourth dielectric layer 105d, and therefore the mechanical strength of the first dielectric layer 105a is substantially greater than the mechanical strength of the second dielectric layer 105b, the mechanical strength of the third dielectric layer 105c and the mechanical strength of the fourth dielectric layer 105d.

In some embodiments, the semiconductor structure 200 includes a bump pad 107 and a conductive bump 108, which have similar configurations as described above or illustrated in FIG. 1. In some embodiments, the bump pad 107 is disposed over the third conductive trace 106c and is extended through the fourth dielectric layer 105d. In some embodiments, the conductive bump 108 is disposed over the bump pad 107.

In some embodiments, the semiconductor structure 200 includes a through via extending through the molding 104. In some embodiments, the through via extends from the substrate 101 towards the first dielectric layer 105a. In some embodiments, the through via is surrounded by the molding 104. In some embodiments, the through via is configured to electrically connect to the first conductive trace 106a. In some embodiments, the through via includes conductive material such as gold, silver, copper, nickel, tungsten, aluminum, tin and/or alloys thereof. In some embodiments, the through via is a through integrated fan out via (TIV).

Figure 3:
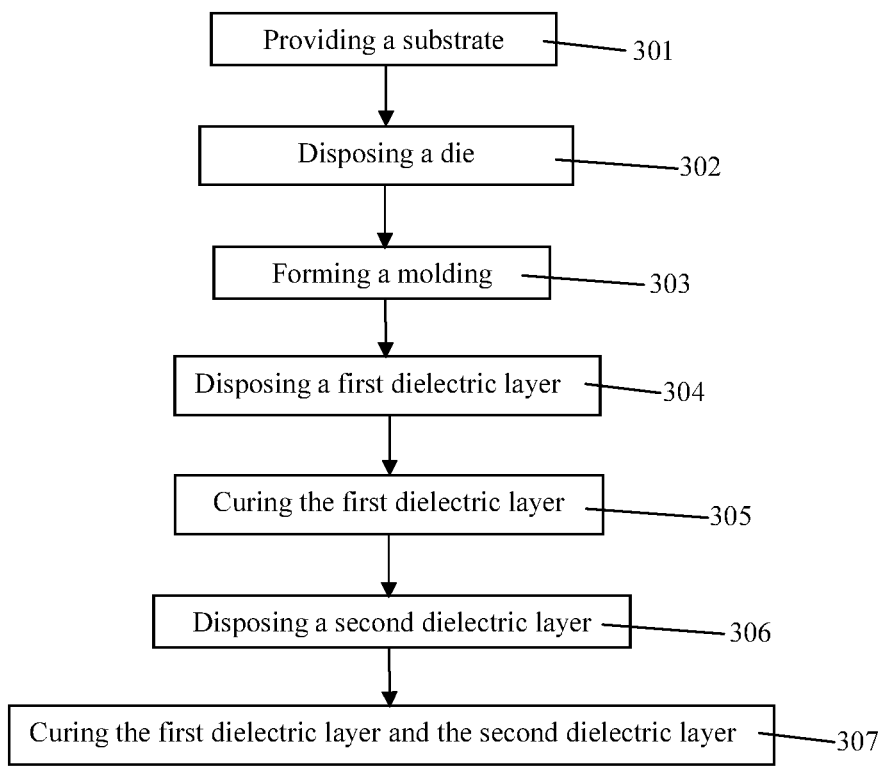
FIG. 3 is a flow diagram of a method of manufacturing a semiconductor structure in accordance with some embodiments of the present disclosure.

In the present disclosure, a method of manufacturing a semiconductor structure 100 is also disclosed. In some embodiments, a semiconductor structure 100 is formed by a method 300. The method 300 includes a number of operations and the description and illustration are not deemed as a limitation as the sequence of the operations. FIG. 3 is an embodiment of the method 300 of manufacturing the semiconductor structure 100. The method 300 includes a number of operations (301, 302, 303, 304, 305, 306 and 307).

In operation 301, a substrate 101 is provided or received as shown in FIG. 3A. In some embodiments, the substrate 101 is configured to permanently or temporarily support components subsequently disposed thereon. In some embodiments, the substrate 101 is a wafer. In some embodiments, the substrate 101 includes silicon, glass, ceramic or the like. In some embodiments, the substrate 101 has similar configuration as described above or illustrated in FIG. 1 or 2.

In operation 302, a die 103 is disposed over the substrate 101 as shown in FIG. 3B. In some embodiments, the die 103 is placed on and attached to the substrate 101 by an adhesive 102 such as glue, tape, die attach film (DAF), etc. In some embodiments, the die 103 is singulated from a wafer. In some embodiments, the die 103 is disposed over substrate 101 by die placement operations. In some embodiments, the die 103 includes a die substrate 103a, a die pad 103b, a passivation 103c, a conductive via 103d and a dielectric material 103e. In some embodiments, the dielectric material 103e is disposed over the die substrate 103a and surrounds the conductive via 103d. In some embodiments, the dielectric material 103e includes PBO or HTPBO. In some embodiments, the die 103 has similar configuration as described above or illustrated in FIG. 1 or 2.

Figure 3C:
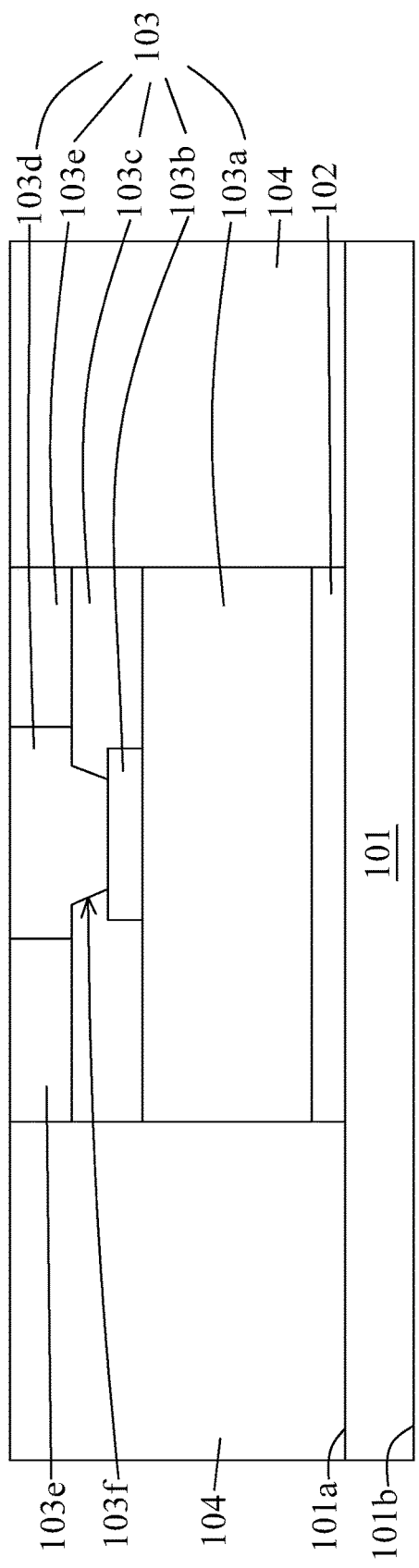

In operation 303, a molding 104 is formed as shown in FIG. 3C. In some embodiments, the molding 104 is disposed over the substrate 101 and surrounds the die 103. In some embodiments, the molding 104 is formed by disposing a molding material over the substrate 101, and then grinding the molding material to thin down the molding material until exposing the die 103. In some embodiments, the molding 104 is formed by transfer molding, injection molding or any other suitable operations. In some embodiments, the molding 104 has similar configuration as described above or illustrated in FIG. 1 or 2.

Figure 3D:
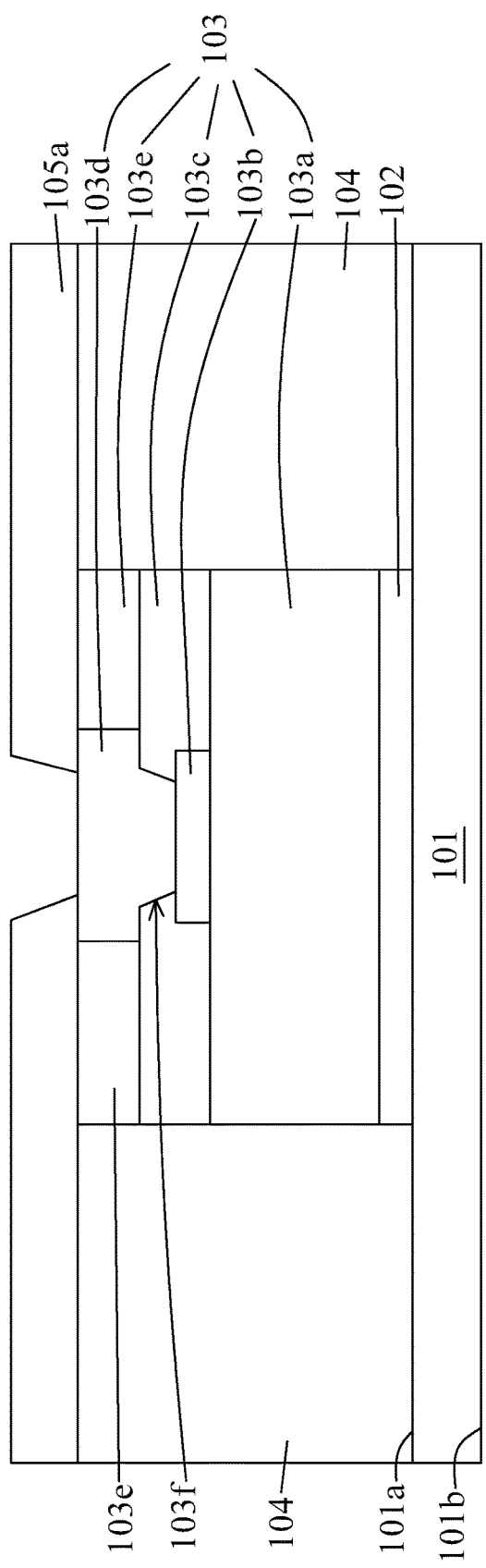

In operation 304, a first dielectric layer 105a is disposed over the die 103 and the molding 104 as shown in FIG. 3D. In some embodiments, the first dielectric layer 105a is disposed by spin coating, chemical vapor deposition (CVD) or any other suitable operations. In some embodiments, the first dielectric layer 105a is interfaced with the dielectric material 103e. In some embodiments, the first dielectric layer 105a includes different material from the dielectric material 103e. In some embodiments, the first dielectric layer 105a includes PI. In some embodiments, the first dielectric layer 105a is disposed and then patterned by photolithography and etching operations. In some embodiments, a portion of the first dielectric layer 105a is removed, so as to expose a portion of the conductive via 103d or a portion of the die pad 103b.

In operation 305, the first dielectric layer 105a is heated or cured. In some embodiments, the first dielectric layer 105a is cured under a curing condition. In some embodiments, the first dielectric layer 105a is cured under a predetermined temperature. In some embodiments, the first dielectric layer 105a is cured in a reflow oven or any other suitable apparatuses. In some embodiments, the first dielectric layer 105a is cured at the predetermined temperature of substantially less than or equal to about 250° C. In some embodiments, the first dielectric layer 105a is cured at the predetermined temperature of about 230° C.

In some embodiments, the first dielectric layer 105a is cured for about 10 hours under the predetermined temperature of substantially less than or equal to about 250° C. In some embodiments, the first dielectric layer 105a is cured for 1 hour under the predetermined temperature of about 250° C. In some embodiments, the first dielectric layer 105a is cured for 1 hour under the predetermined temperature of about 230° C. In some embodiments, the curing of the first dielectric layer 105a for 10 hours includes curing the first dielectric layer 105a for about 1 hour under the predetermined temperature of about 250° C. In some embodiments, the curing of the first dielectric layer 105a for 10 hours includes curing the first dielectric layer 105a for about 1 hour under the predetermined temperature of about 230° C.

Figure 3E:
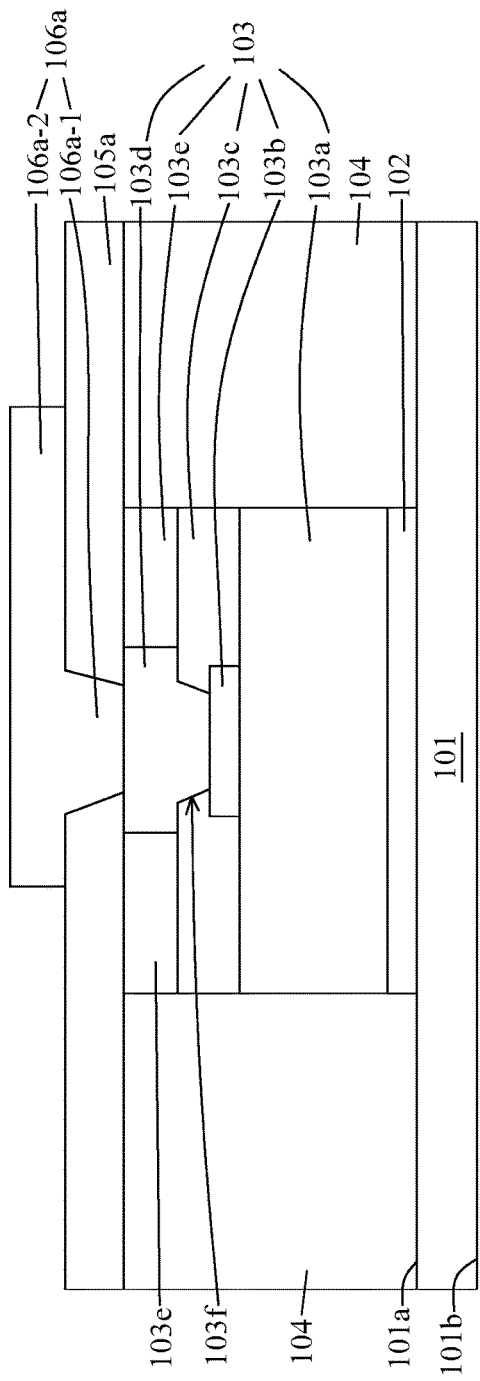

In some embodiments, a first conductive trace 106a is formed as shown in FIG. 3E. In some embodiments, the first conductive trace 106a is disposed over and partially extended through the first dielectric layer 105a. In some embodiments, the first conductive trace 106a is formed by disposing a conductive material over the first dielectric layer 105a and within the portion of the first dielectric layer 105a being removed. In some embodiments, the conductive material includes copper, gold, silver, etc. In some embodiments, the first conductive trace 106a is disposed by electroplating, sputtering or other suitable operations. In some embodiments, the first conductive trace 106a has similar configuration as described above or illustrated in FIG. 1 or 2.

Figure 3F:
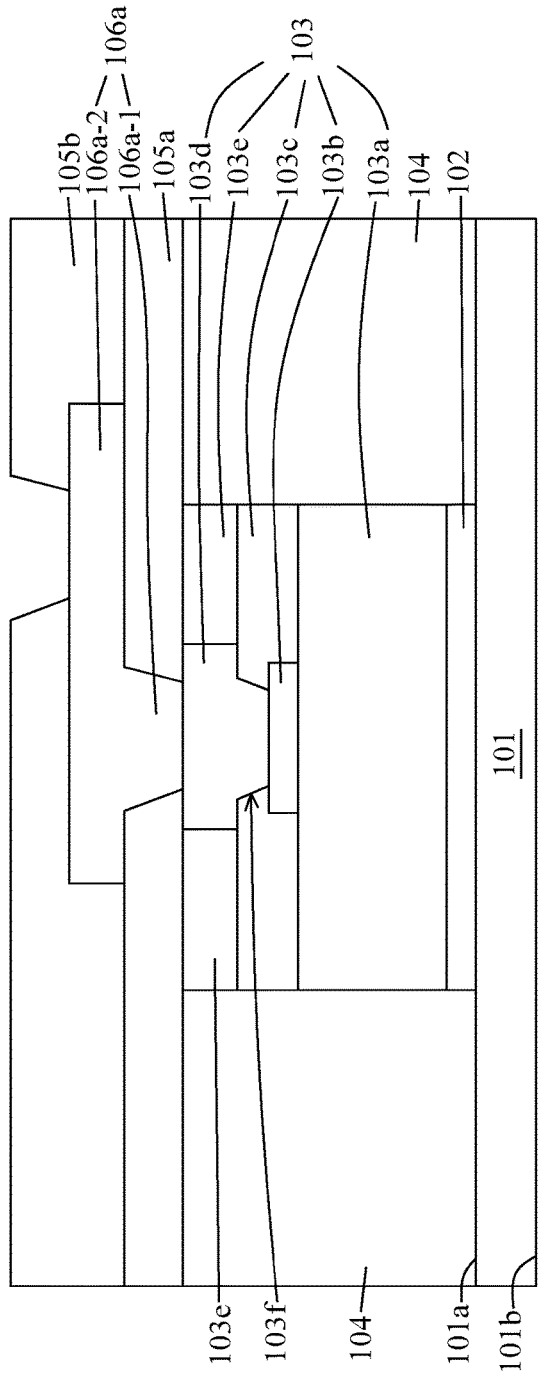

In operation 306, a second dielectric layer 105b is disposed over the first dielectric layer 105a as shown in FIG. 3F. In some embodiments, the second dielectric layer 105b surrounds the first conductive trace 106a. In some embodiments, the second dielectric layer 105b is disposed by spin coating, chemical vapor deposition (CVD) or any other suitable operations. In some embodiments, the second dielectric layer 105b is interfaced with the first dielectric layer 105a. In some embodiments, the second dielectric layer 105b includes different material from the dielectric material 103e. In some embodiments, the second dielectric layer 105b includes PI. In some embodiments, the second dielectric layer 105b is disposed and then patterned by photolithography and etching operations. In some embodiments, a portion of the second dielectric layer 105b is removed, so as to expose a portion of the first conductive trace 106a.

In operation 307, the first dielectric layer 105a and the second dielectric layer 105b are heated or cured. In some embodiments, the first dielectric layer 105a and the second dielectric layer 105b are cured under the predetermined temperature. In some embodiments, the first dielectric layer 105a and the second dielectric layer 105b are cured in a reflow oven or any other suitable apparatuses. In some embodiments, the first dielectric layer 105a and the second dielectric layer 105b are cured at the predetermined temperature of substantially less than or equal to about 250° C.

In some embodiments, the first dielectric layer 105a and the second dielectric layer 105b are cured at the predetermined temperature of about 230° C.

In some embodiments, the first dielectric layer 105a and the second dielectric layer 105b are cured for about 10 hours under the predetermined temperature of substantially less than or equal to about 250° C. In some embodiments, the first dielectric layer 105a and the second dielectric layer 105b are cured for 1 hour under the predetermined temperature of about 250° C. In some embodiments, the first dielectric layer 105a and the second dielectric layer 105b are cured for 1 hour under the predetermined temperature of about 230° C. In some embodiments, the curing of the first dielectric layer 105a and the second dielectric layer 105b for 10 hours includes curing the first dielectric layer 105a and the second dielectric layer 105b for about 1 hour under the predetermined temperature of about 250° C. In some embodiments, the curing of the first dielectric layer 105a and the second dielectric layer 105b for 10 hours includes curing the first dielectric layer 105a and the second dielectric layer 105b for about 1 hour under the predetermined temperature of about 230° C. In some embodiments, the first dielectric layer 105a and the second dielectric layer 105b have similar configurations as described above or illustrated in FIG. 1 or 2.

In some embodiments, since the first dielectric layer 105a has cured for longer period of time than the second dielectric layer 105b, an oxygen ratio of the second dielectric layer 105b is substantially greater than an oxygen ratio of the first dielectric layer 105a and a nitrogen ratio of the second dielectric layer 105b is substantially greater than a nitrogen ratio of the first dielectric layer 105a. In some embodiments, the oxygen ratio of the first dielectric layer 105a is about 5% to about 10% of oxygen in the first dielectric layer 105a. In some embodiments, the oxygen ratio of the second dielectric layer 105b is about 10% to about 13% of oxygen in the second dielectric layer 105b. In some embodiments, the nitrogen ratio of the first dielectric layer 105a is about 15% to about 20% of nitrogen in the first dielectric layer 105a. In some embodiments, the nitrogen ratio of the second dielectric layer 105b is about 20% to about 25% of oxygen in the second dielectric layer 105b.

In some embodiments, the oxygen ratio of the first dielectric layer 105a is substantially less than the oxygen ratio of the second dielectric layer 105b, and therefore the mechanical strength of the first dielectric layer 105a is substantially greater than the mechanical strength of the second dielectric layer 105b. In some embodiments, the nitrogen ratio of the first dielectric layer 105a is substantially less than the nitrogen ratio of the second dielectric layer 105b, and therefore the mechanical strength of the first dielectric layer 105a is substantially greater than the mechanical strength of the second dielectric layer 105b. In some embodiments, CTE of the first dielectric layer 105a is different from CTE of the dielectric material 103e, while the first dielectric layer 105a can resist a stress or warpage caused by CTE mismatch between the first dielectric layer 150a and the dielectric material 103e.

Figure 3G:
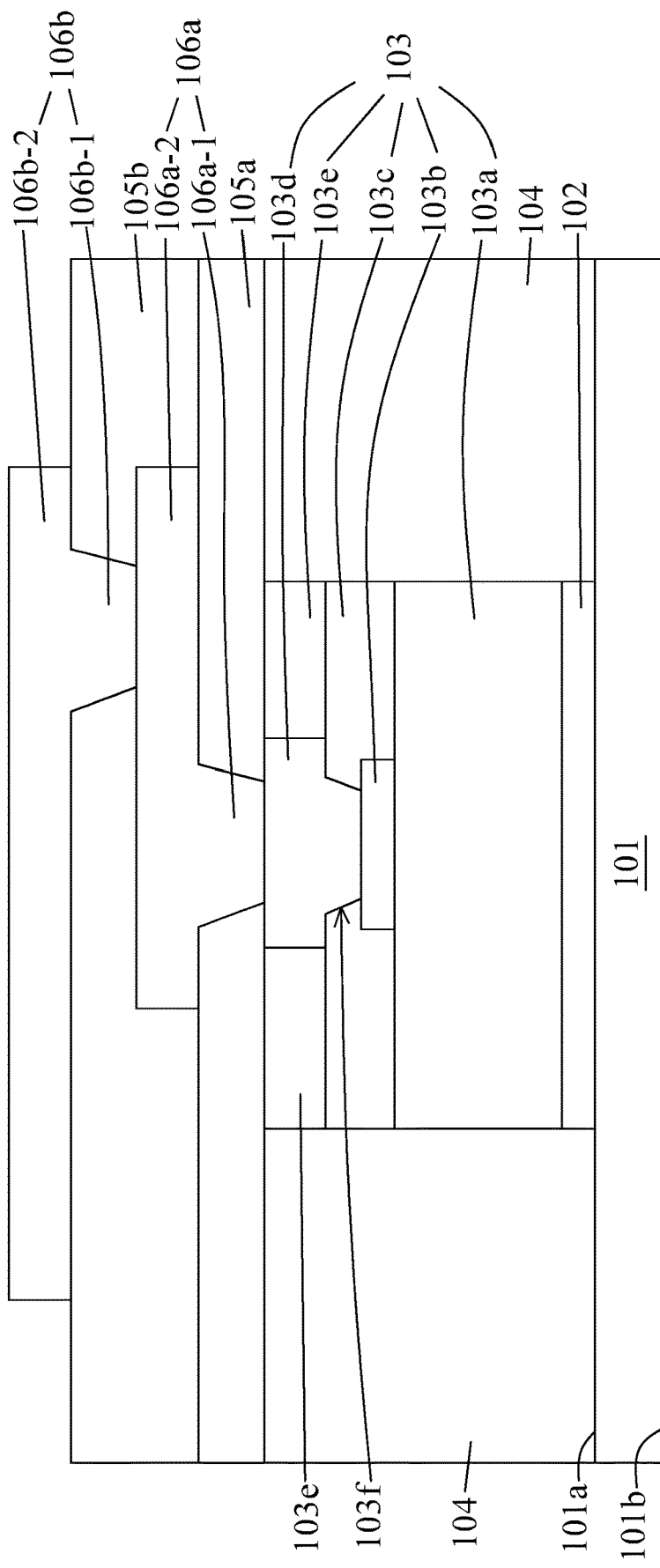

In some embodiments, a second conductive trace 106b is formed as shown in FIG. 3G. In some embodiments, the second conductive trace 106b is disposed over and partially extended through the second dielectric layer 105b. In some embodiments, the second conductive trace 106b is formed by disposing a conductive material over the second dielectric layer 105b and within the portion of the second dielectric layer 105b being removed. In some embodiments, the conductive material includes copper, gold, silver, etc. In some embodiments, the second conductive trace 106b is disposed by electroplating, sputtering or other suitable operations. In some embodiments, the second conductive trace 106b has similar configuration as described above or illustrated in FIG. 1 or 2.

Figure 3H:
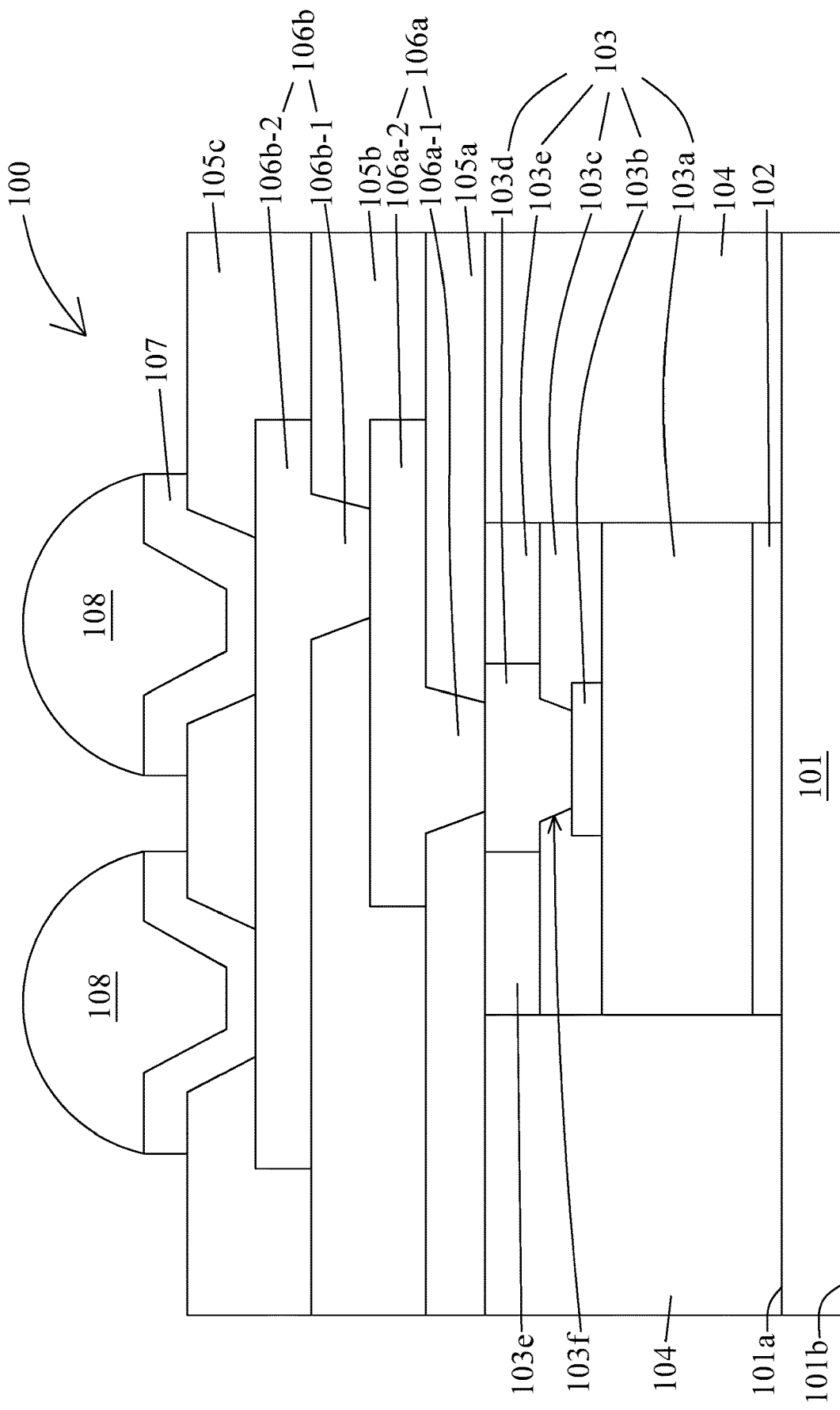

In some embodiments, a third dielectric layer 105c, a bump pad 107 and a conductive bump 108 are disposed as shown in FIG. 3H. In some embodiments, the third dielectric layer 105c is disposed over the second dielectric layer 105b and surrounds the second conductive trace 106b. In some embodiments, the third dielectric layer 105c is disposed by spin coating, chemical vapor deposition (CVD) or any other suitable operations. In some embodiments, the third dielectric layer 105c is interfaced with the second dielectric layer 105b. In some embodiments, the third dielectric layer 105c includes different material from the dielectric material 103e. In some embodiments, the third dielectric layer 105c includes PI. In some embodiments, the third dielectric layer 105c is disposed and then patterned by photolithography and etching operations. In some embodiments, a portion of the third dielectric layer 105c is removed, so as to expose a portion of the second conductive trace 106b. In some embodiments, the third dielectric layer 105c has similar configuration as described above or illustrated in FIG. 1 or 2.

In some embodiments, the bump pad 107 is formed over the third dielectric layer 105c and the second conductive trace 106b. In some embodiments, the bump pad 107 is electrically connected to the second conductive trace 106b, the first conductive trace 106a, the conductive via 103d or the die pad 103b. In some embodiments, the bump pad 107 is formed by evaporation, sputtering, electroplating or any other suitable operations. In some embodiments, the bump pad 107 has similar configuration as described above or illustrated in FIG. 1 or 2.

In some embodiments, the conductive bump 108 is disposed over and electrically connected to the bump pad 107. In some embodiments, the conductive bump 108 is disposed by ball dropping, solder pasting, stencil printing or other suitable operations. In some embodiments, the conductive bump 108 is heated or reflowed. In some embodiments, the conductive bump 108 has similar configuration as described above or illustrated in FIG. 1 or 2. In some embodiments, a semiconductor structure 100 is formed.

Figure 4:
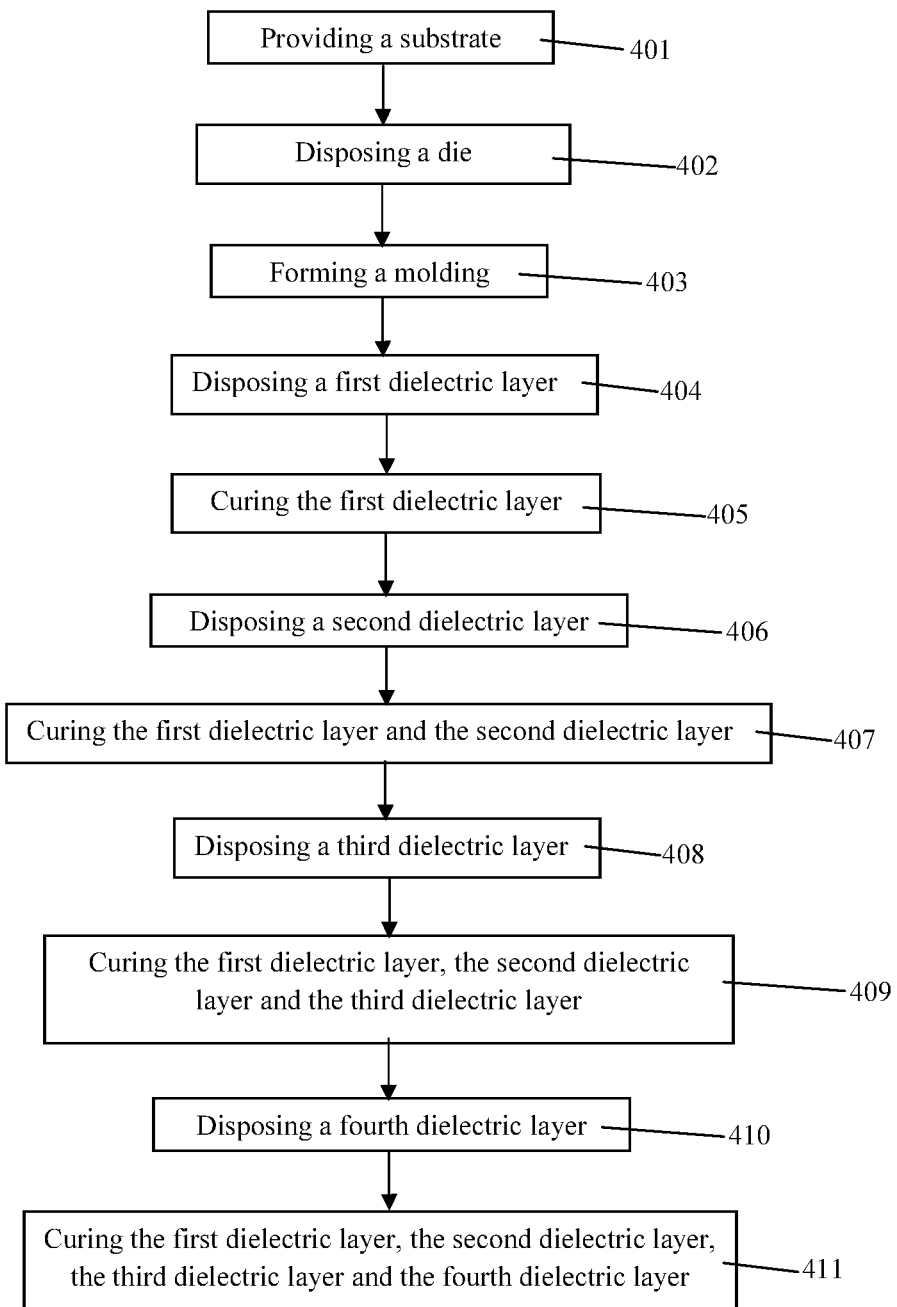
FIG. 4 is a flow diagram of a method of manufacturing a semiconductor structure in accordance with some embodiments of the present disclosure.

In the present disclosure, a method of manufacturing a semiconductor structure 100 is also disclosed. In some embodiments, a semiconductor structure 200 is formed by a method 400. The method 400 includes a number of operations and the description and illustration are not deemed as a limitation as the sequence of the operations. FIG. 4 is an embodiment of the method 400 of manufacturing the semiconductor structure 200. The method 300 includes a number of operations (401, 402, 403, 404, 405, 406, 407, 408, 409, 410 and 411).

In operation 401, a substrate 101 is provided or received as shown in FIG. 3A, which is similar to the operation 301. In operation 402, a die 103 is disposed over the substrate 101 as shown in FIG. 3B, which is similar to the operation 302. In operation 403, a molding 104 is formed as shown in FIG. 3C, which is similar to the operation 303. In operation 404, a first dielectric layer 105a is disposed over the die 103 and the molding 104 as shown in FIG. 3D, which is similar to the operation 304. In operation 405, the first dielectric layer 105a is heated or cured, which is similar to the operation 305. In operation 406, a second dielectric layer 105b is disposed over the first dielectric layer 105a as shown in FIG. 3F, which is similar to the operation 306. In operation 407, the first dielectric layer 105a and the second dielectric layer 105b are heated or cured, which is similar to the operation 307.

Figure 4A:
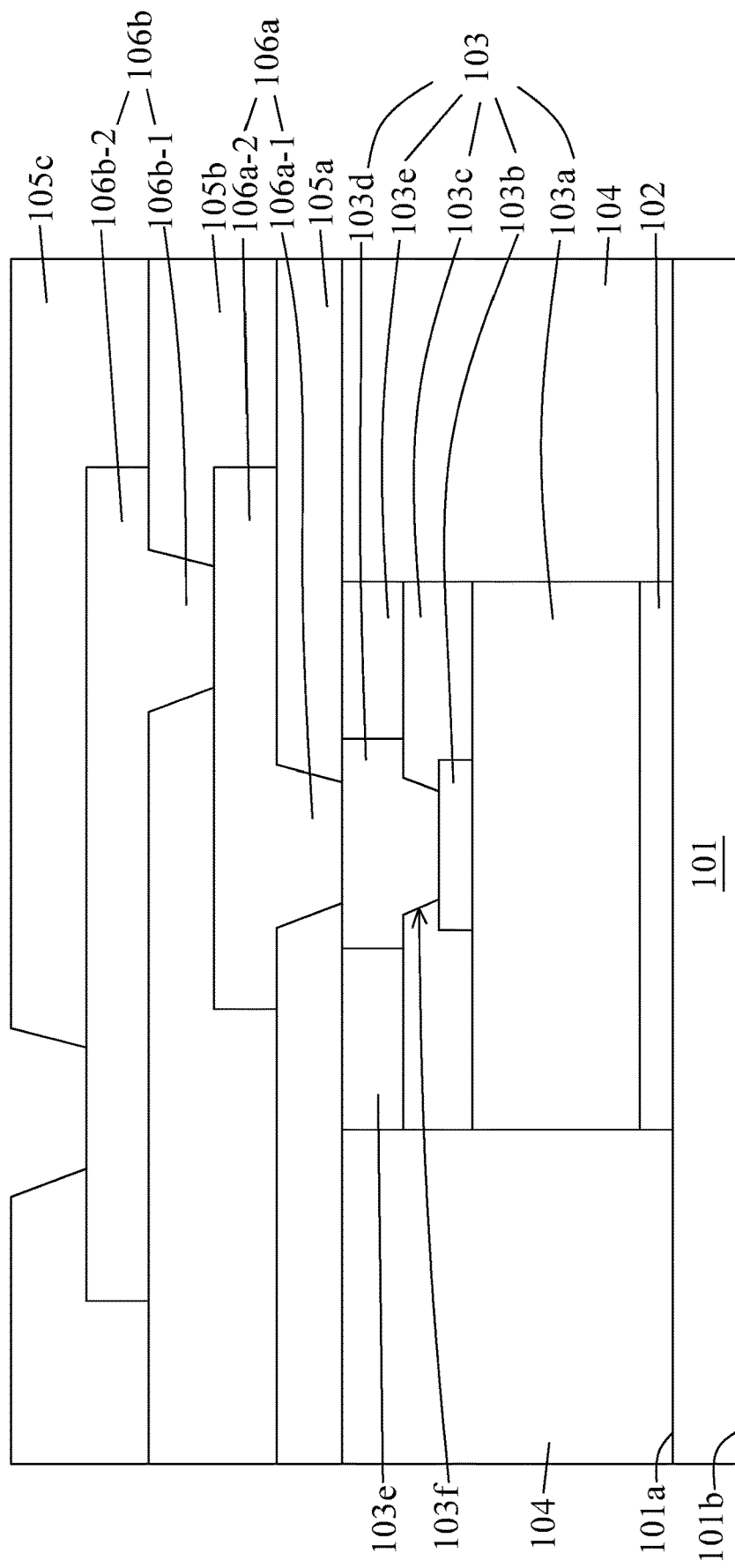
FIGS. 4A-4D are schematic views of manufacturing a semiconductor structure by a method of FIG. 4 in accordance with some embodiments of the present disclosure.

In operation 408, a third dielectric layer 105c is disposed over the second dielectric layer 105b as shown in FIG. 4A. In some embodiments, the third dielectric layer 105c surrounds the second conductive trace 106b. In some embodiments, the third dielectric layer 105c is disposed by spin coating, chemical vapor deposition (CVD) or any other suitable operations. In some embodiments, the third dielectric layer 105c is interfaced with the second dielectric layer 105b. In some embodiments, the third dielectric layer 105c includes different material from the dielectric material 103e. In some embodiments, the third dielectric layer 105c includes PI. In some embodiments, the third dielectric layer 105c is disposed and then patterned by photolithography and etching operations. In some embodiments, a portion of the third dielectric layer 105c is removed, so as to expose a portion of the second conductive trace 106b.

In operation 409, the first dielectric layer 105a, the second dielectric layer 105b and the third dielectric layer 105c are heated or cured. In some embodiments, the first dielectric layer 105a, the second dielectric layer 105b and the third dielectric layer 105c are cured under the predetermined temperature. In some embodiments, the first dielectric layer 105a, the second dielectric layer 105b and the third dielectric layer 105c are cured in a reflow oven or any other suitable apparatuses. In some embodiments, the first dielectric layer 105a, the second dielectric layer 105b and the third dielectric layer 105c are cured at the predetermined temperature of substantially less than or equal to about 250° C. In some embodiments, the first dielectric layer 105a, the second dielectric layer 105b and the third dielectric layer 105c are cured at the predetermined temperature of about 230° C.

In some embodiments, the first dielectric layer 105a, the second dielectric layer 105b and the third dielectric layer 105c are cured for about 10 hours under the predetermined temperature of substantially less than or equal to about 250° C. In some embodiments, the first dielectric layer 105a, the second dielectric layer 105b and the third dielectric layer 105c are cured for 1 hour under the predetermined temperature of about 250° C. In some embodiments, the first dielectric layer 105a, the second dielectric layer 105b and the third dielectric layer 105c are cured for 1 hour under the predetermined temperature of about 230° C. In some embodiments, the curing of the first dielectric layer 105a, the second dielectric layer 105b and the third dielectric layer 105c for 10 hours includes curing the first dielectric layer 105a, the second dielectric layer 105b and the third dielectric layer 105c for about 1 hour under the predetermined temperature of about 250° C. In some embodiments, the curing of the first dielectric layer 105a, the second dielectric layer 105b and the third dielectric layer 105c for 10 hours includes curing the first dielectric layer 105a, the second dielectric layer 105b and the third dielectric layer 105c for about 1 hour under the predetermined temperature of about 230° C.

Figure 4B:
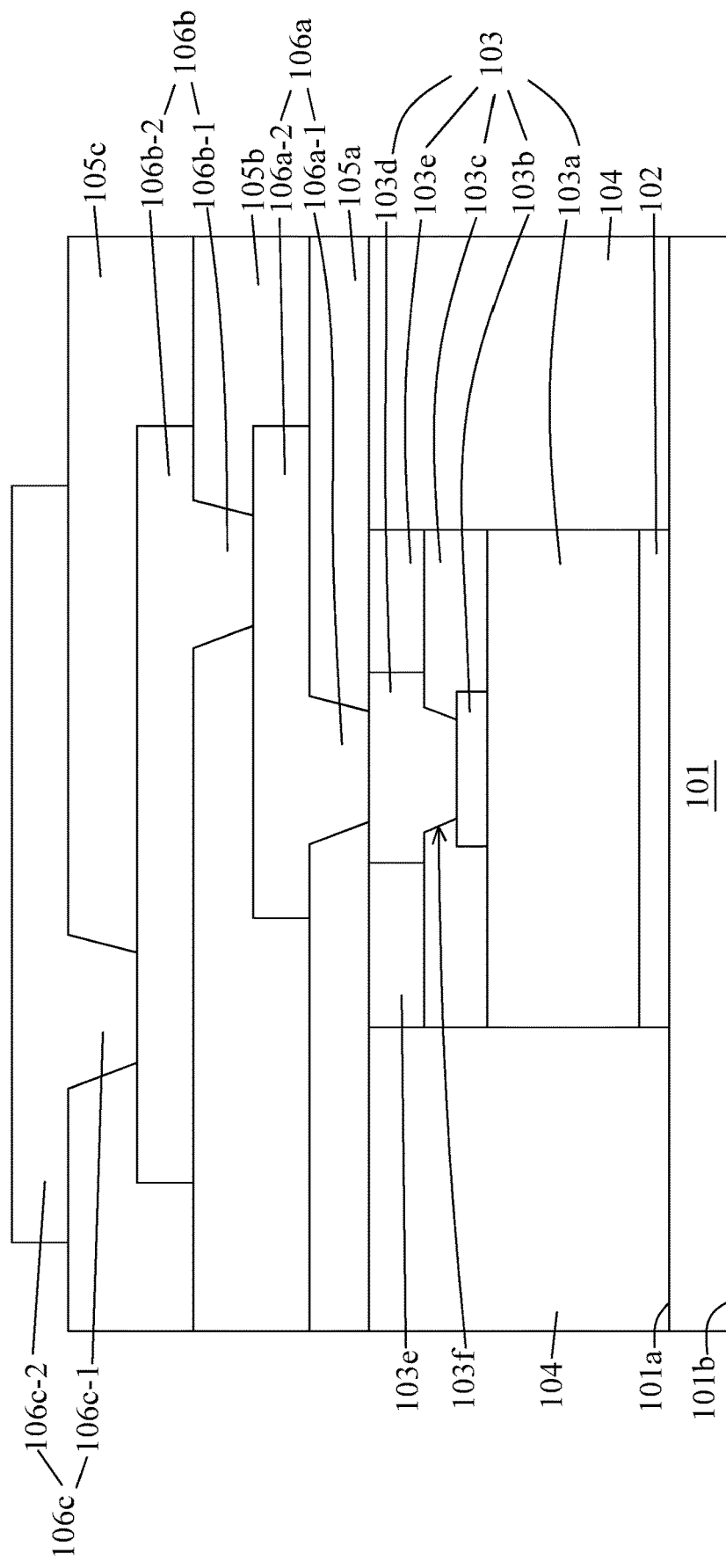

In some embodiments, a third conductive trace 106c is formed as shown in FIG. 4B. In some embodiments, the third conductive trace 106c is disposed over and partially extended through the third dielectric layer 105c. In some embodiments, the third conductive trace 106c is formed by disposing a conductive material over the third dielectric layer 105c and within the portion of the third dielectric layer 105c being removed. In some embodiments, the conductive material includes copper, gold, silver, etc. In some embodiments, the third conductive trace 106c is disposed by electroplating, sputtering or other suitable operations. In some embodiments, the third conductive trace 106c has similar configuration as described above or illustrated in FIG. 1 or 2.

Figure 4C:
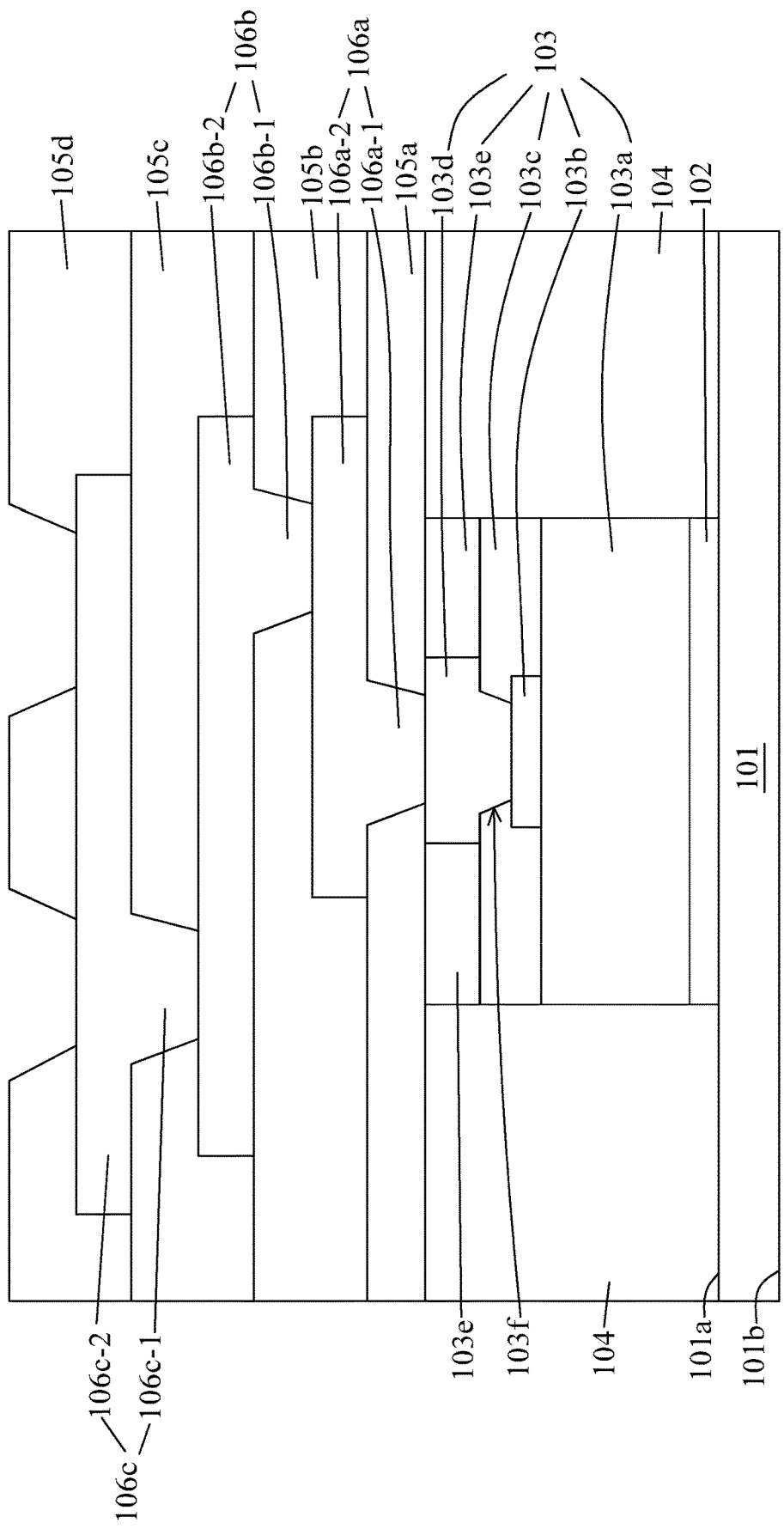

In operation 410, a fourth dielectric layer 105d is disposed over the third dielectric layer 105c as shown in FIG. 4C. In some embodiments, the fourth dielectric layer 105d surrounds the third conductive trace 106c. In some embodiments, the fourth dielectric layer 105d is disposed by spin coating, chemical vapor deposition (CVD) or any other suitable operations. In some embodiments, the fourth dielectric layer 105d is interfaced with the third dielectric layer 105c. In some embodiments, the fourth dielectric layer 105d includes different material from the dielectric material 103e. In some embodiments, the fourth dielectric layer 105d includes PI. In some embodiments, the fourth dielectric layer 105d is disposed and then patterned by photolithography and etching operations. In some embodiments, a portion of the fourth dielectric layer 105d is removed, so as to expose a portion of the third conductive trace 106c.

In operation 411, the first dielectric layer 105a, the second dielectric layer 105b, the third dielectric layer 105c and the fourth dielectric layer 105d are heated or cured. In some embodiments, the first dielectric layer 105a, the second dielectric layer 105b, the third dielectric layer 105c and the fourth dielectric layer 105d are cured under the predetermined temperature. In some embodiments, the first dielectric layer 105a, the second dielectric layer 105b, the third dielectric layer 105c and the fourth dielectric layer 105d are cured in a reflow oven or any other suitable apparatuses. In some embodiments, the first dielectric layer 105a, the second dielectric layer 105b, the third dielectric layer 105c and the fourth dielectric layer 105d are cured at the predetermined temperature of substantially less than or equal to about 250° C. In some embodiments, the first dielectric layer 105a, the second dielectric layer 105b, the third dielectric layer 105c and the fourth dielectric layer 105d are cured at the predetermined temperature of about 230° C.

In some embodiments, the first dielectric layer 105a, the second dielectric layer 105b, the third dielectric layer 105c and the fourth dielectric layer 105d are cured for about 10 hours under the predetermined temperature of substantially less than or equal to about 250° C. In some embodiments, the first dielectric layer 105a, the second dielectric layer 105b, the third dielectric layer 105c and the fourth dielectric layer 105d are cured for 1 hour under the predetermined temperature of about 250° C. In some embodiments, the first dielectric layer 105a, the second dielectric layer 105b, the third dielectric layer 105c and the fourth dielectric layer 105d are cured for 1 hour under the predetermined temperature of about 230° C. In some embodiments, the curing of the first dielectric layer 105a, the second dielectric layer 105b, the third dielectric layer 105c and the fourth dielectric layer 105d for 10 hours includes curing the first dielectric layer 105a, the second dielectric layer 105b, the third dielectric layer 105c and the fourth dielectric layer 105d for about 1 hour under the predetermined temperature of about 250° C. In some embodiments, the curing of the first dielectric layer 105a, the second dielectric layer 105b, the third dielectric layer 105c and the fourth dielectric layer 105d for 10 hours includes curing the first dielectric layer 105a, the second dielectric layer 105b, the third dielectric layer 105c and the fourth dielectric layer 105d for about 1 hour under the predetermined temperature of about 230° C. In some embodiments, the third dielectric layer 105c and the fourth dielectric layer 105d have similar configurations as described above or illustrated in FIG. 1 or 2.

In some embodiments, since the first dielectric layer 105a has cured for longer period of time than the second dielectric layer 105b, the third dielectric layer 105c and the fourth dielectric layer 105d, the first dielectric layer 105a is fully cured compared with the e second dielectric layer 105b, the third dielectric layer 105c and the fourth dielectric layer 105d. As such, impurities such as oxygen or nitrogen in the first dielectric layer 105a are substantially less than impurities in the second dielectric layer 105b, impurities in the third dielectric layer 105c or impurities in the fourth dielectric layer 105d. Therefore, a mechanical strength of the first dielectric layer 105a is substantially greater than a mechanical strength of the second dielectric layer 105b, a mechanical strength of the third dielectric layer 105c or a mechanical strength of the fourth dielectric layer 105d. In some embodiments, an oxygen content ratio of the fourth dielectric layer 105d is substantially greater than an oxygen content ratio of the first dielectric layer 105a, an oxygen content ratio of the second dielectric layer 105b and an oxygen content ratio of the third dielectric layer 105c. In some embodiments, a nitrogen content ratio of the fourth dielectric layer 105d is substantially greater than a nitrogen content ratio of the first dielectric layer 105a, a nitrogen content ratio of the second dielectric layer 105b and a nitrogen content ratio of the third dielectric layer 105c.

In some embodiments, the oxygen content ratio of the first dielectric layer 105a is about 5% to about 10% of overall content in the first dielectric layer 105a. In some embodiments, the oxygen content ratio of the second dielectric layer 105b is about 10% to about 13% of overall content in the second dielectric layer 105b. In some embodiments, the oxygen content ratio of the third dielectric layer 105c is about 10% to about 13% of overall content in the third dielectric layer 105c. In some embodiments, the oxygen content ratio of the fourth dielectric layer 105d is about 12% to about 18% of overall content in the fourth dielectric layer 105d. In some embodiments, an adhesion between the fourth dielectric layer 105d with oxygen content ratio of about 12% to about 18% and the third dielectric layer 105c with oxygen content ratio of about 10% to about 13% is maximized. In some embodiments, an adhesion between the first dielectric layer 105a with oxygen content ratio of about 6% to about 10% and the second dielectric layer 105b with oxygen content ratio of about 10% to about 13% is maximized.

In some embodiments, the nitrogen content ratio of the first dielectric layer 105a is about 15% to about 20% of overall content in the first dielectric layer 105a. In some embodiments, the nitrogen content ratio of the second dielectric layer 105b is about 20% to about 25% of overall content in the second dielectric layer 105b. In some embodiments, the nitrogen content ratio of third dielectric layer 105c is about 20% to about 25% of overall content in the third dielectric layer 105c. In some embodiments, the nitrogen content ratio of the fourth dielectric layer 105d is about 20% to about 25% of overall content in the third dielectric layer 105c. In some embodiments, an adhesion between the fourth dielectric layer 105d with nitrogen content ratio of about 210% to about 25% and the third dielectric layer 105c with nitrogen content ratio of about 20% to about 25% is maximized. In some embodiments, an adhesion between the first dielectric layer 105a with oxygen content ratio of about 15% to about 20% and the second dielectric layer 105b with oxygen content ratio of about 20% to about 25% is maximized.

In some embodiments, the oxygen content ratio of the first dielectric layer 105a is substantially less than the oxygen content ratio of the second dielectric layer 105b, the oxygen content ratio of the third dielectric layer 105c and the oxygen content ratio of the fourth dielectric layer 105d, and therefore the mechanical strength of the first dielectric layer 105a is substantially greater than the mechanical strength of the second dielectric layer 105b, the mechanical strength of the third dielectric layer 105c and the mechanical strength of the fourth dielectric layer 105d. In some embodiments, the nitrogen content ratio of the first dielectric layer 105a is substantially less than the nitrogen content ratio of the second dielectric layer 105b, the nitrogen content ratio of the third dielectric layer 105c and the nitrogen content ratio of the fourth dielectric layer 105d, and therefore the mechanical strength of the first dielectric layer 105a is substantially greater than the mechanical strength of the second dielectric layer 105b, the mechanical strength of the third dielectric layer 105c and the mechanical strength of the fourth dielectric layer 105d. In some embodiments, CTE of the first dielectric layer 105a is different from CTE of the dielectric material 103e, while the first dielectric layer 105a can resist a stress or warpage caused by CTE mismatch between the first dielectric layer 150a and the dielectric material 103e.

Figure 4D:
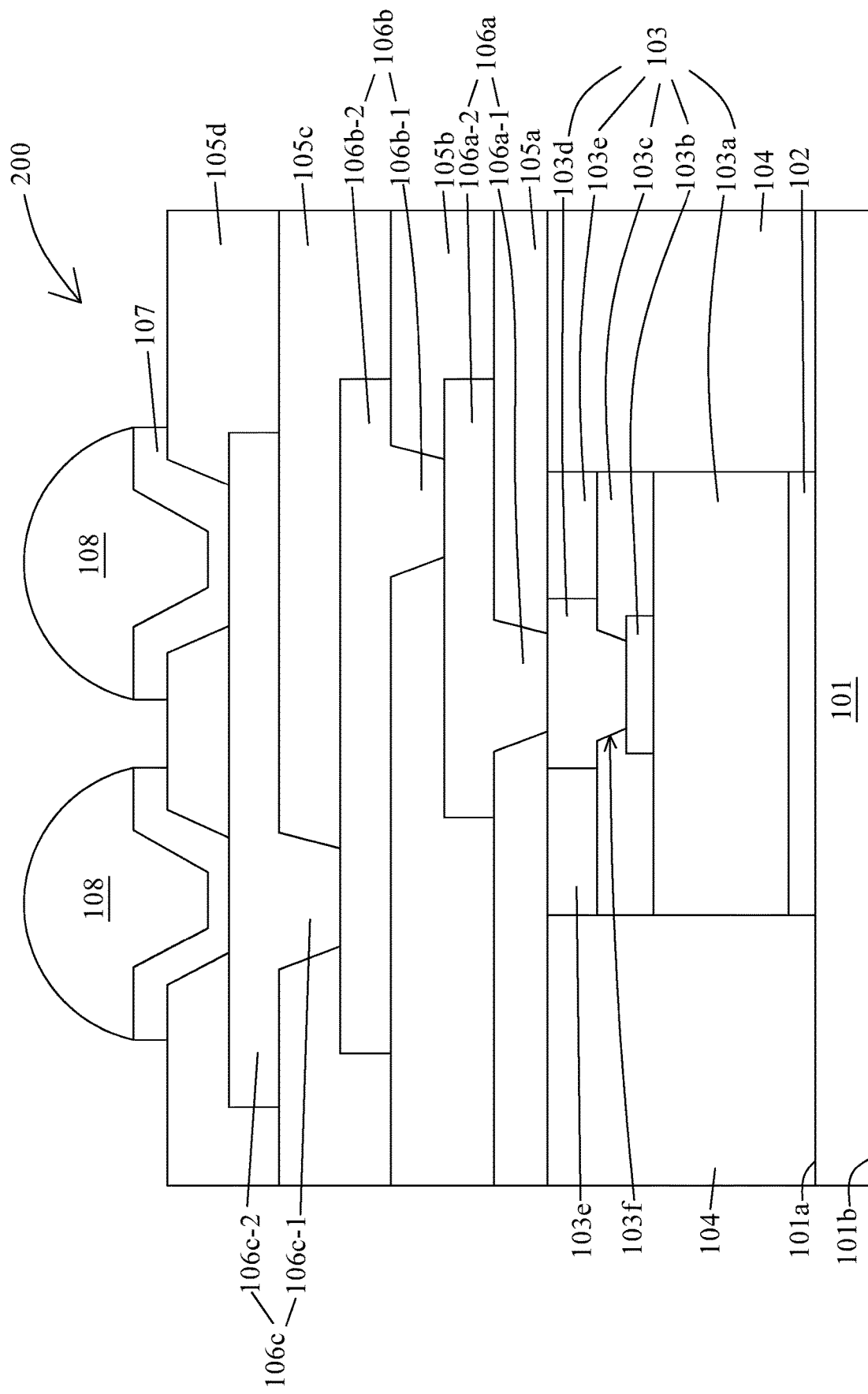

In some embodiments, the bump pad 107 is formed over the fourth dielectric layer 105d and the third conductive trace 106c as shown in FIG. 4D. In some embodiments, the bump pad 107 is electrically connected to the third conductive trace 106c, the second conductive trace 106b, the first conductive trace 106a, the conductive via 103d or the die pad 103b. In some embodiments, the bump pad 107 is formed by evaporation, sputtering, electroplating or any other suitable operations. In some embodiments, the bump pad 107 has similar configuration as described above or illustrated in FIG. 1 or 2.

In some embodiments, the conductive bump 108 is disposed over and electrically connected to the bump pad 107 as shown in FIG. 4D. In some embodiments, the conductive bump 108 is disposed by ball dropping, solder pasting, stencil printing or other suitable operations. In some embodiments, the conductive bump 108 is heated or reflowed. In some embodiments, the conductive bump 108 has similar configuration as described above or illustrated in FIG. 1 or 2. In some embodiments, a semiconductor structure 200 is formed.

In the present disclosure, a semiconductor structure with improvement is disclosed. The semiconductor structure includes several dielectric layers disposed over each other. The dielectric layer adjacent to the die is cured for a longer period of time than other dielectric layers, and therefore oxygen or nitrogen in the dielectric layer adjacent to the die is less than other dielectric layers. As such, a mechanical strength of the dielectric layer adjacent to the die is greater than other dielectric layers, and the dielectric layer adjacent to the die can resist a stress caused by CTE mismatch between components. As a result, warpage or development of cracks can be minimized or prevented.

In some embodiments, a semiconductor structure is provided. The semiconductor structure includes a die, a molding surrounding the die, a first dielectric layer disposed over the die and the molding, and a second dielectric layer disposed between the first dielectric layer and the die, and between the first dielectric layer and the molding. In some embodiments, a material content ratio in the first dielectric layer is substantially greater than that in the second dielectric layer. In some embodiments, the material content ratio substantially inversely affects a mechanical strength of the first dielectric layer and the second dielectric layer.

In some embodiments, a semiconductor structure is provided. The semiconductor structure includes a die, a lower dielectric layer disposed over the die, an upper dielectric layer disposed over the lower dielectric layer, and an intermediate dielectric layer disposed between the lower dielectric layer and the upper dielectric layer. In some embodiments, a material content ratio in the upper dielectric layer is substantially greater than that in the lower dielectric layer and the intermediate dielectric layer. In some embodiments, a thickness of the upper dielectric layer is substantially greater than a thickness of the lower dielectric layer.

In some embodiments, a semiconductor structure is provided. The semiconductor structure includes a die, a lower dielectric layer disposed over the die, an upper dielectric layer disposed over the lower dielectric layer, a first conductive trace in the lower dielectric layer and electrically connected to the die, a second conductive trace in the upper dielectric layer and electrically connected to the first conductive trace, a bump pad electrically connected to the second conductive trace, and a conductive bump over the bump pad. In some embodiments, a thickness of the upper dielectric layer and the lower dielectric layer are substantially inverse with a Young's modulus of the upper dielectric layer and the lower dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a die, wherein the die further comprise:
        a die substrate;
        a die pad over the die substrate;
        a conductive via over the die pad; and
        a dielectric material surrounding the conductive via;
    a molding surrounding the die;
    a first dielectric layer disposed over the die and the molding; and
    a second dielectric layer disposed between the first dielectric layer and the die, and between the first dielectric layer and the molding,
    wherein the dielectric material of the die is surrounded by the molding, a top surface of the dielectric material is aligned with a top surface of the conductive via and aligned with a top surface of the molding, a material content ratio in the first dielectric layer is substantially greater than that in the second dielectric layer, and the material content ratio substantially inversely affects a mechanical strength of the first dielectric layer and the second dielectric layer.

2. The semiconductor structure of claim 1, wherein the material content ratio includes at least one of oxygen content ratio or nitrogen content ratio.

3. The semiconductor structure of claim 2, wherein the oxygen content ratio of the second dielectric layer is substantially less than about 10% of overall content in the second dielectric layer, or the nitrogen content ratio of the second dielectric layer is substantially less than about 20% of overall content in the second dielectric layer.

4. The semiconductor structure of claim 2, wherein the oxygen content ratio of the first dielectric layer is greater than about 10% of overall content in the first dielectric layer, or the nitrogen content ratio of the first dielectric layer is greater than about 20% of overall content in the first dielectric layer.

5. The semiconductor structure of claim 1, wherein the first dielectric layer and the second dielectric layer include same material.

6. The semiconductor structure of claim 1, wherein the first dielectric layer and the second dielectric layer include different materials.

7. The semiconductor structure of claim 1, wherein a thickness of the first dielectric layer is substantially greater than a thickness of the second dielectric layer.

8. The semiconductor structure of claim 1, further comprising a conductive trace, wherein the conductive trace further comprises:
    a via portion disposed in the second dielectric layer; and
    a land portion disposed in the first dielectric layer,
    wherein the via portion electrically connects the conductive via of the die and the land portion of the conductive trace.

9. A semiconductor structure, comprising:
    a die;
    a lower dielectric layer disposed over the die;
    an upper dielectric layer disposed over the lower dielectric layer; and
    an intermediate dielectric layer disposed between the lower dielectric layer and the upper dielectric layer,
    wherein a material content ratio in the upper dielectric layer is substantially greater than that in the lower dielectric layer and the intermediate dielectric layer, and a thickness of the upper dielectric layer is substantially greater than a thickness of the lower dielectric layer.

10. The semiconductor structure of claim 9, wherein the material content ratio includes at least one of oxygen content ratio or nitrogen content ratio.

11. The semiconductor structure of claim 10, wherein the oxygen content ratio of the intermediate dielectric layer is substantially greater than the oxygen content ratio of the lower dielectric layer, or the nitrogen content ratio of the intermediate dielectric layer is substantially greater than the nitrogen ratio of the lower dielectric layer.

12. The semiconductor structure of claim 10, wherein the oxygen content ratio of the upper dielectric layer is about 12% to about 20% of overall content in the upper dielectric layer, or the nitrogen content ratio of the upper dielectric layer is about 20% to about 25% of overall content in the upper dielectric layer.

13. The semiconductor structure of claim 9, further comprising:
    a first conductive trace disposed in the lower dielectric layer and the intermediate dielectric layer;
    a second conductive trace disposed in the intermediate dielectric layer and the upper dielectric layer,
    wherein the first conductive trace is electrically connected to the die, and the second conductive trace is electrically connected to the first conductive trace.

14. The semiconductor structure of claim 13, further comprising:

a topmost dielectric layer disposed over the upper dielectric layer, and the top dielectric layer exposing at least a portion of the second conductive trace;

at least a bump pad disposed over the topmost dielectric layer and the second conductive trace; and at least a conductive bump disposed over the bump pad.

15. The semiconductor structure of claim 14, wherein a material content ratio in the topmost dielectric layer is substantially greater than that in the upper dielectric layer.

16. A semiconductor structure, comprising:

a die;

a lower dielectric layer disposed over the die;

an upper dielectric layer disposed over the lower dielectric layer;

a first conductive trace in the lower dielectric layer and electrically connected to the die, wherein the first conductive trace comprises:

a first via portion disposed in the lower dielectric layer; and a first land portion disposed in the upper dielectric layer;

a second conductive trace in the upper dielectric layer and electrically connected to the first conductive trace;

a bump pad electrically connected to the second conductive trace; and a conductive bump over the bump pad, wherein a thickness of the upper dielectric layer and the lower dielectric layer are substantially inverse with a Young's modulus of the upper dielectric layer and the lower dielectric layer.

17. The semiconductor structure of claim 16, wherein the thickness of the upper dielectric layer is greater than the thickness of the lower dielectric layer.

18. The semiconductor structure of claim 16, wherein the second conductive trace comprises:

a second via portion disposed in the upper dielectric layer; and a second land portion disposed over the upper dielectric layer and in contact with the bump pad.

19. The semiconductor structure of claim 16, further comprising a molding surrounding the die.

20. The semiconductor structure of claim 19, wherein a bottom surface of the lower dielectric layer is in contact with the molding.

* * * * *